US008077922B1

(12) United States Patent
Barrows

(10) Patent No.: US 8,077,922 B1
(45) Date of Patent: Dec. 13, 2011

(54) OPTICAL FLOW SENSOR

(76) Inventor: Geoffrey L. Barrows, Washington, DC (US)

( * ) Notice: Subject to any disclaimer, the term of this patent is extended or adjusted under 35 U.S.C. 154(b) by 1044 days.

(21) Appl. No.: 11/905,853

(22) Filed: Oct. 4, 2007

(51) Int. Cl.
*G06K 9/00* (2006.01)
(52) U.S. Cl. ........................................................ 382/107
(58) Field of Classification Search .................. 382/100, 382/107, 312, 321; 356/28, 373; 73/1.41; 702/142
See application file for complete search history.

(56) References Cited

U.S. PATENT DOCUMENTS

| | | | | |
|---|---|---|---|---|
| 5,511,133 A | * | 4/1996 | Shimizu et al. | 382/156 |
| 5,828,444 A | * | 10/1998 | Nomura | 356/28 |
| 5,998,780 A | * | 12/1999 | Kramer | 250/221 |
| 6,020,953 A | * | 2/2000 | Barrows | 356/28 |
| 6,194,695 B1 | | 2/2001 | Barrows | |
| 6,384,905 B1 | * | 5/2002 | Barrows | 356/28 |

OTHER PUBLICATIONS

Barrows, G., et al., "Mixed-Mode VLSI Optic Flow Sensors for In-flight Control of Micro Air Vehicle", SPIE Critical Technologies for the Future of Computing, Jul. 31-Aug. 4, 2000, vol. 4109.

* cited by examiner

*Primary Examiner* — Anand Bhatnagar
(74) *Attorney, Agent, or Firm* — McDermott Will & Emery LLP

(57) ABSTRACT

An optical flow sensor for generating optical flow measurements based on a visual field is provided. The optical flow sensor comprises a binarized signal generator capable of generating binarized feature signals based on the visual field, a metafeature signal generator capable of generating metafeature signals based on the binarized feature signals, an apparatus for generating velocity reports based on the metafeature signals, and an apparatus for generating an optical flow measurement based on the velocity reports.

4 Claims, 11 Drawing Sheets

G. BARROWS: "OPTICAL FLOW SENSOR"

G. BARROWS: "OPTICAL FLOW SENSOR"

OPTICAL FLOW SENSOR

TECHNICAL FIELD

The teachings presented herein relate to electronic sensors and integrated circuits for sensing the visual environment.

BACKGROUND

The term "optical flow" generally refers to the apparent motion of texture seen by an agent (such as an animal or a robot) as a result of relative motion between the agent and other objects in the environment. It is well known that animals, especially insects, use information from optical flow for depth perception and navigating through an environment without colliding into obstacles. An introduction to the concept of optical flow may be found in the book "The Ecological Approach to Visual Perception", by J. Gibson, published by Lawrence Erlbaum Associates in 1986. Some examples of how insects utilize optical flow for navigation may be found in issue 199(1) of the Journal of Experimental Biology, edited by Wehner, Lehrer, and Harvey, and published in 1996 by The Company of Biologists Limited. Robotics and machine vision researchers have borrowed from these examples in biology to build machine vision systems that use optical flow for depth perception and obstacle avoidance in real environments. Examples of how optical flow may be used to perform some robotic tasks may be found in the paper "Biological Inspired Visual Sensing and Flight Control" by Barrows, Chahl, and Srinivasan, which appeared in the March 2003 issue of The Aeronautical Journal published by The Royal Aeronautical Society. Many other examples may be found in the academic literature.

The term "optical flow" is generally described in the academic literature as a vector field, with the domain of the vector field equal to the spherical visual field and the vectors representing the apparent velocity of visual texture in the visual field. In this document, the term "optical flow" will be used in a broader sense to include all types of visual motion that may be measured.

Machine vision systems capable of computing optical flow or visual motion in a compact package may be implemented with the use of specialized hardware. An imaging sensor is a device that is capable of sensing imagery based on light focused thereon. A machine visual sensing system or a vision sensor may be defined as an imaging sensory system having both image sensing and image processing functions, whether these functions are all performed primarily on a single chip or on a multiple chip system. In a "neuromorphic" approach, some or all computations may be performed with analog or mixed-signal circuits (i.e. mixed analog and digital) which exploit the physical dynamics inherent in VLSI (very large scale integration) circuitry and may additionally mimic biological structures. One source that provides such "neuromorphic" approaches is a book entitled "Analog VLSI and Neural Systems" by C. Mead, published by Addison Wesley in 1989. A related approach is to use "vision chips", which are defined herein to be integrated circuits having both image acquisition circuitry and image processing circuitry in the same device, including within the same monolithic die. One book that provides methods of implementing vision chips is "Towards the Visual Microprocessor" edited by T. Roska and A. Rodríguez-Vázquez, and published by Wiley in 2001. Another book that provides methods of implementing vision chips is "Vision Chips" by A. Moini and published by Kluwer Academic Publishing in 1999. When either of the above mentioned approaches is properly executed, it is possible to implement a machine vision system capable of performing a given set of tasks in a package substantially smaller than that when utilizing a conventional CMOS (complementary metal-oxide-semiconductor) or CCD (charge coupled device) imager connected to a high-performance processor.

In U.S. Pat. No. 6,020,953, a motion sensing apparatus and method, referred herein as the "competitive feature tracker" (CFT) algorithm, are disclosed. The approach described therein can be implemented using a vision chip. One instance of the aforementioned apparatus or algorithm may be referred to as an "elementary motion detector" or "EMD" that produces an optical flow measurement computed based on the motion of a specific feature across the visual field. Although a device implementing this apparatus or algorithm may be able to measure optical flow when exposed to real-world textures and, hence, able to measure optical flow even when the texture contrast is significantly lower than what is normally found in nature, the device may make occasional erroneous measurements especially as the texture contrast becomes even lower.

To address this issue, a method of fusing EMD outputs in order to increase the reliability of the optical flow measurement was developed, which is disclosed in U.S. Pat. No. 6,384,905. An optical flow sensor as described therein utilizes multiple arrays of feature detectors, with each array configured to track a different feature across the visual field. This sensor implements multiple EMDs that monitor the same portion of the visual field, with each EMD monitoring the motion with respect to a different feature. The output of each individual EMD may be referred to as a "velocity report" since it is a single report of the measured optical flow velocity. The sensor then combines the velocity reports produced by different EMDs in such a manner that individual erroneous velocity reports are filtered out. The sensor then produces a single optical flow measurement that is statistically more reliable.

Further details on the implementation of the teachings of the two aforementioned patents may be found in the following papers: "Feature Tracking Linear Optic Flow Sensor Chip" by Miller and Barrows and included in the proceedings of the IEEE 1999 International Symposium on Circuits and Systems (ISCAS '99); "Fusing Neuromorphic Motion Detector Outputs for Robust Optical Flow Measurement" by Barrows, Miller, and Krantz and included in the proceedings of the IEEE 1999 International Joint Conference on Neural Networks (ISCAS '99); and "Mixed-Mode VLSI Optical Flow Sensors for In-Flight Control of a Micro Air Vehicle" by Barrows and Neely and included in SPIE Volume 4109, published by SPIE in 2000. Further details may also be found in the Ph.D. dissertation entitled "Mixed-Mode VLSI Optic Flow Sensors for Micro Air Vehicles" written by Barrows in 1999 at the University of Maryland at College Park. Additional details may be found in the book chapter "Optical Flow Sensors for UAV Navigation" by Barrows, Neely, and Miller, which was published as part of the book entitled "Fixed and Flapping Wing Aerodynamics for Micro Air Vehicle Applications" and published by AIAA in 2001.

Although the sensors described in the two aforementioned patents are practical, there remains an issue related to the aspect of the CFT algorithm disclosed in the aforementioned patents. In practice, additional steps are necessary to perform arbitration (or conditioning) on the feature location signals to handle cases when more than one feature location signal is concurrently high. Arbitration may be performed based on a combination of low-pass filters and arbitration logic, which require extra instructions and/or additional circuitry to implement. However, without such arbitration, the sensor's performance degrades. To minimize the amount of circuitry on a chip or device, a method to achieve reliable performance without arbitration is needed.

BRIEF DESCRIPTION OF THE DRAWINGS

The inventions claimed and/or described herein are further described in terms of exemplary embodiments. These exemplary embodiments are described in detail with reference to the drawings. These embodiments are non-limiting exemplary embodiments, in which like reference numerals represent similar structures throughout the several views of the drawings, and wherein:

CONVENTIONS AND DEFINITIONS

Figure 1:
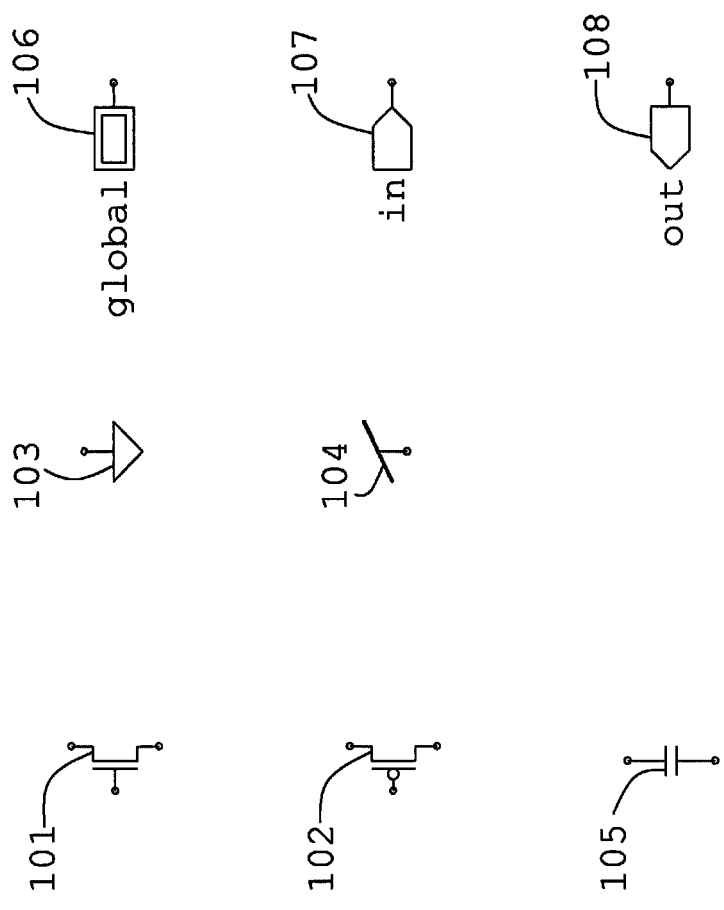
FIG. 1 depicts several schematic symbols that will be used to signify various electronic components and connections used in exemplary embodiments of the present teaching.

Refer to FIG. 1, which shows several circuit diagram symbols that will be used to signify various electronic components and connections in the present teachings. In FIG. 1, symbol 101 depicts an N-channel MOSFET (metal-oxide-semiconductor field effect transistor), also referred to as an NMOS transistor or an N-FET transistor. Symbol 102 depicts a P-channel MOSFET, also referred to as a PMOS transistor or a P-FET transistor. Symbol 103 depicts a reference potential which will be referred to as Ground or GND. Symbol 104 depicts a power supply potential which will be referred to as Power or VDD. Symbol 105 depicts a capacitor. Symbol 106 depicts a global node or a global signal. In this example, this global node is given the name "global". Global nodes may be electrical nodes that are commonly connected in all instances of the circuit depicted and any other circuits. Examples of global nodes may include bias voltages or global clock signals.

In addition, symbol 107 depicts an input node. In this example, this input node is given the name "in". Input nodes are electrical nodes of a particular circuit that may receive signals from other circuits. Symbol 108 depicts an output node. In this example, this output node is given the name "out". Output nodes are electrical nodes of a particular circuit that may generate signals used by other circuits.

DESCRIPTIONS OF EXEMPLARY EMBODIMENTS

Figure 2:
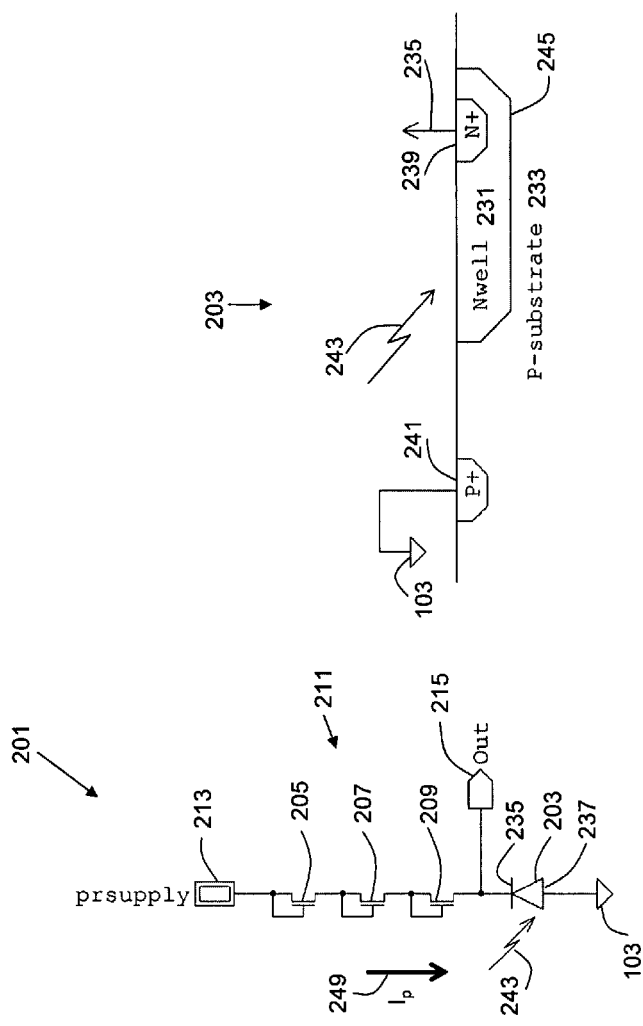
FIG. 2A illustrates an exemplary photoreceptor circuit.
FIG. 2B illustrates a cross section of a photodiode in a photoreceptor circuit according to an embodiment of the present teaching.
FIG. 2C illustrates a schematic symbol used to signify a photoreceptor circuit according to an embodiment of the present teaching.

A photoreceptor circuit is any circuit that may be configured to generate at least one signal, called a "photoreceptor signal", that represents the amount of light that is striking the circuit. FIG. 2A depicts an exemplary photoreceptor circuit 201. The photoreceptor circuit 201 comprises an N-well photodiode 203, which sinks to ground 103 an amount of current proportional to the amount of light striking the photodiode 203. The photodiode 203 may also be constructed from other diode or phototransistor structures such as diffusion-to-substrate structures or phototransistors, or any appropriate photoconductive element that conducts electricity according to the amount of light striking the photoconductive element. Three diode-connected N-channel transistors 205, 207, and 209 connected in series form a transduction circuit 211. Photodiode 203 is connected to one end of the transduction circuit 211. The other end of the transduction circuit 211 is connected to the global photoreceptor power supply node prsupply 213. The photoreceptor circuit contains one output node out 215.

FIG. 2B, illustrates a cross section of photodiode 203 in photoreceptor circuit 201 according to an embodiment of the present teaching. In this exemplary embodiment, the photodiode 203 may be implemented with an N-well 231 that is lying in a lightly doped P-substrate 233. The N-side 235 of the photodiode may be implemented using an N-diffusion contact 239 within the N-well 231. The P-side 237 of the photodiode 203 is located within the P-substrate 233, and may be connected to ground 103 via a substrate P-contact 241 located near the N-well 231. The P-substrate 233 may thus be considered equivalent to ground 103.

The circuit as illustrated in FIG. 2A operates as follows. Since the photodiode 203 is reverse-biased, its N-side 235 is more positive than its P-side 237. When there is no light (e.g., in the dark), the photodiode 203 conducts no current other than a small amount of current generated by heat (known as "dark current"). When light 243 strikes the photodiode 203, electron-hole pairs are generated near the junction 245 between the P-substrate 233 and the N-well 231. This allows electrons to flow up from the P-substrate 233 to the N-well 231 and out through the N-side 235. This results in current $I_p$ 249 flowing from the global node prsupply 213, through the transduction circuit 211, the photodiode 203, and into the substrate 233. In this description, the direction of current flow is the direction of "hole flow" which is the opposite direction as that of electron flow. The prsupply node 213 is set to a positive voltage sufficient for the diode-connected N-channel transistors 205, 207, and 209 to be forward-biased and for the node out 215 to have a positive voltage.

As the amount of light 243 striking the photodiode 203 increases, so does the current 249 flowing through the circuit. This current $I_p$ 249 results in a voltage potential across the transduction circuit 211 that increases as the current $I_p$ 249 increases. The voltage potential at node out 215 thus decreases as the current $I_p$ 249 increases. In many real-world environments, the transistors 205, 207, and 209 operate in the subthreshold mode, which means that the voltage drop across them is a logarithmic function of the current $I_p$ 249. Thus the voltage at node out 215 would be a logarithmic function of the amount of light striking the photodiode 203. This voltage potential at node out 215 becomes the output of the exemplary photoreceptor circuit. The signal located at node out 215 is thus the "photoreceptor signal" generated by the photoreceptor circuit 201.

FIG. 2C illustrates a schematic symbol used to signify a photoreceptor circuit according to an embodiment of the present teaching. The photoreceptor circuit 201 shown in FIGS. 2A and 2C is an exemplary realization of a photoreceptor circuit that generates a photoreceptor signal based on light. The fabrication of such circuits is a well-known art. Any circuit that may be configured to generate at least one photoreceptor signal based on light is candidate for use as a photoreceptor circuit. Note that a photoreceptor may be realized using any other implementations known in the art and the description presented herein is for illustration purposes and does not limit the scope of the present teaching.

An array of photoreceptor circuits may be used with an optical apparatus, such as a lens or a pinhole, to sample a portion of the visual field. This may be performed by placing the photoreceptor circuits at the focal plane of the lens, or at a predetermined distance from the pinhole, so that an image of the visual field is formed on the photoreceptor circuits. The light patterns projected by the optical assembly onto the photoreceptor circuits may be referred to as an "image". The act of generating photoreceptor signals based on the image may be referred to as the act of "grabbing an image".

Figure 3:
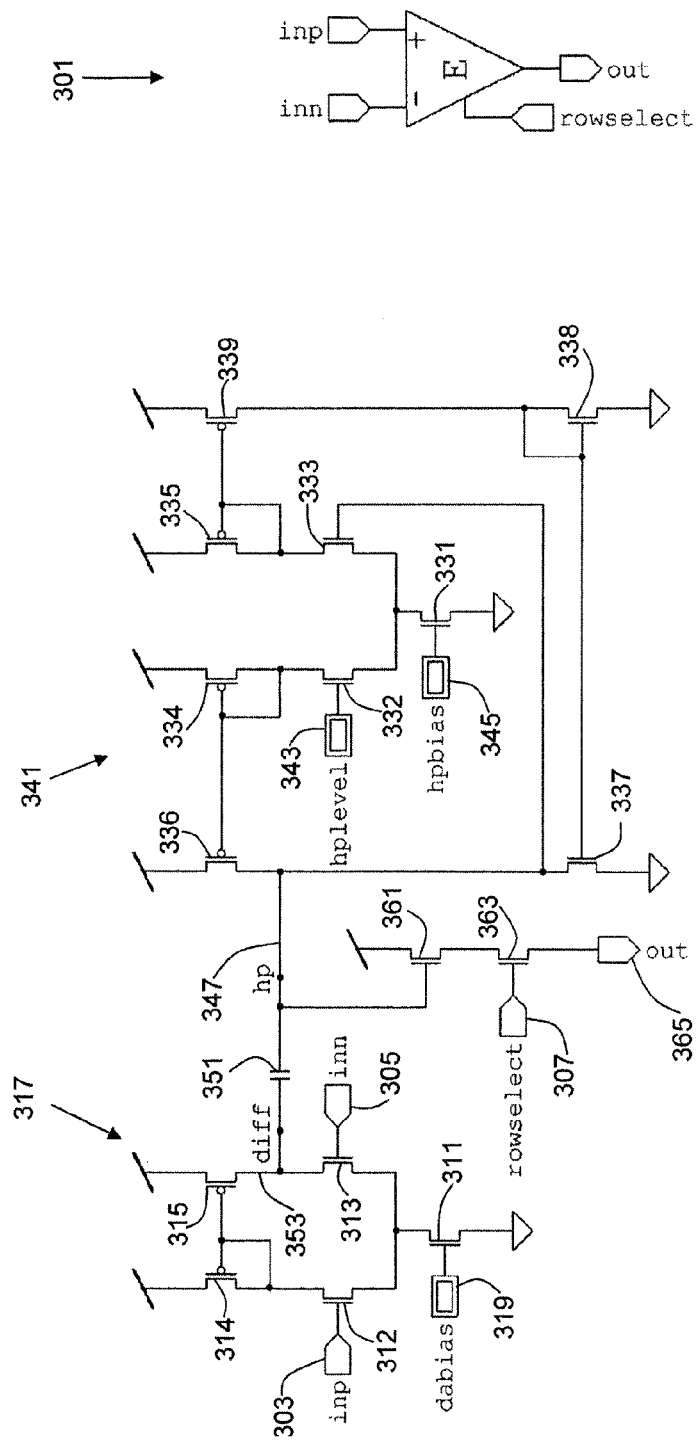
FIG. 3A illustrates an exemplary edge detector circuit.
FIG. 3B illustrates a schematic symbol used to signify an edge detector circuit.

An edge detector circuit is any circuit that may be configured to respond to an edge imagery based on one or more photoreceptor signals. Refer to FIG. 3A, which illustrates an exemplary edge detector circuit 301. This exemplary circuit, as shown, has three inputs: an analog positive input inp 303, an analog negative input inn 305, and a digital input signal rowselect 307. The circuit of FIG. 3A computes the difference between the two analog inputs inp 303 and inn 305, puts the difference through a time domain high-pass filter, and provides an output when rowselect 307 is a digital high.

In this exemplary embodiment, the five transistors 311, 312, 313, 314, and 315 form a classic five-transistor differential amplifier 317. The global node dabias 319 is set to a potential that allows current to flow through the differential pair of transistors 312 and 313. The node dabias 319 effectively turns transistor 311 into a current source. Transistors 314 and 315 form a current mirror, in which transistor 315 is configured to provide a current approximately equal to the source-drain current flowing through transistor 314. Transistors 314 and 315 used in this manner form an "active load", which may enable the differential amplifier 317 to have a differential voltage gain on the order of tens or hundreds or more. This high voltage gain is because the "load resistance" seen by the amplifier is based on channel length modulation in transistors 315 and 313. The output of the differential amplifier 317 is at the node entitled diff 353. Any differential amplifier having an active load at the output may be referred to as a differential amplifier with an active load. In addition, any differential amplifier whose voltage gain is substantially determined by channel length modulation (or the Early effect when using bipolar junction transistors) in the amplifier's transistors whose drains (or collectors when using bipolar transistors) are connected to the differential amplifier's output node may also be referred to as a differential amplifier having an active load. Differential amplifier 317 may thus be referred to as a five-transistor differential amplifier with an active load.

In the illustrated embodiment, the nine transistors 331, 332, 333, 334, 335, 336, 337, 338, and 339 form an "operational transconductance amplifier" or "OTA" 341 that is configured to have its negative input connected to its output. The OTA circuit 341 is biased with two global nodes hplevel 343 and hpbias 345. The potential of hplevel 343 is set to a potential approximately midway between ground 103 and power 104. The potential of hpbias 345 may be set to a potential slightly above ground 103 such that the nine transistors of the OTA 341 are operating in the subthreshold mode. OTA 341 gently pulls the voltage at node hp 347 towards the potential set by global node hplevel 343. From the perspective of node hp 347, the OTA circuit 341 behaves as a high value resistor with one end connected to hp 347 and the other end connected to hplevel 343, and whose resistance is determined by the bias hpbias 345.

In the illustrated embodiment, the differential amplifier 317 and OTA 341 are connected together using a capacitor 351. When connected as such, the voltage at node hp 347 will effectively be a time domain high-passed version of the differential amplifier output diff 353, with a cutoff frequency determined by the potential hpbias 345 and the value of the capacitor 351. When the input signals inp 303 and inn 305 are non-changing or varying very slowly, the node hp 347 will tend to have a potential close to that of global node hplevel 343. When the input signals inp 303 and inn 305 are varying quickly, then the potential hp 347 will vary much like signal diff 353, except that hp 347 and diff 353 will be different by the potential across capacitor 351. Therefore, the capacitor 351 and OTA 341 together effectively behave as a time-domain high pass filter.

In the illustrated embodiment, the purpose of the time domain high pass filter is two-fold. First, the high pass filter eliminates offset inherent in the differential amplifier 317 circuitry and in any input circuits generating inn 305 and inp 303. Second, the high pass filter passes signals that are changing in time, which corresponds to visual motion, while eliminating signals that are not changing in time. Other circuits may be used in place of the capacitor 351 and OTA 341 to implement a time domain high pass filter, and any circuit that substantially passes changing signals while substantially eliminating or reducing non-changing signals may be referred to as a time domain high pass filter.

In the illustrated embodiment, transistors 361 and 363 provide a means of reading out the potential hp 347 to the output node out 365 whenever the digital signal rowselect 307 is switched high. The description of how this is performed will be deferred until the description of FIG. 4. This resulting signal at node out 365 is referred to hereinafter as an "edge signal". When the inputs inp 303 and inn 305 receive photoreceptor signals as inputs, then the edge detector circuit will have a strong response when a visual edge moves in between the photoreceptor circuits providing the two inputs. The response will be positive, i.e. node hp 347 rising above hplevel 343 in potential, or negative, i.e. node hp 347 falling below hplevel 343 in potential, depending on which input gets the brighter side of the visual edge.

FIG. 3B illustrates a schematic symbol used to signify an edge detector circuit.

The exemplary edge detector circuit 301, as shown in FIG. 3A, may generate an edge signal based on one or more photoreceptor signals. The fabrication of differential amplifier circuits and high-pass filter circuits is a well-known art. Any circuit that may be configured to generate at least one edge signal based on one or more photoreceptor signals may be referred to as an edge detector circuit or simply as an edge detector. Furthermore the output of any edge detector circuit may be referred to as an edge signal.

Likewise, the five-transistor differential amplifier 317 is an exemplary implementation of a differential amplifier having an active load circuit. A differential amplifier may be implemented in any way known in the art and, as understood, the illustration described herein does not limit the scope of the present teaching. A differential amplifier can be any circuit or device having at least two inputs and at least one output, and generates an output signal that is substantially a linear function of two inputs. Furthermore, a differential amplifier may be referred to as having an "active load" if it is able to produce an output using active devices, such as transistors, and substantially without use of a passive resistor, or if the output resistance seen by the differential amplifier and thus it's gain is due substantially to channel length modulation (or equivalently the Early effect when using bipolar junction transistors) in it's transistors whose drains (or collectors when using bipolar junction transistors) are connecting to the output node.

Figure 4:
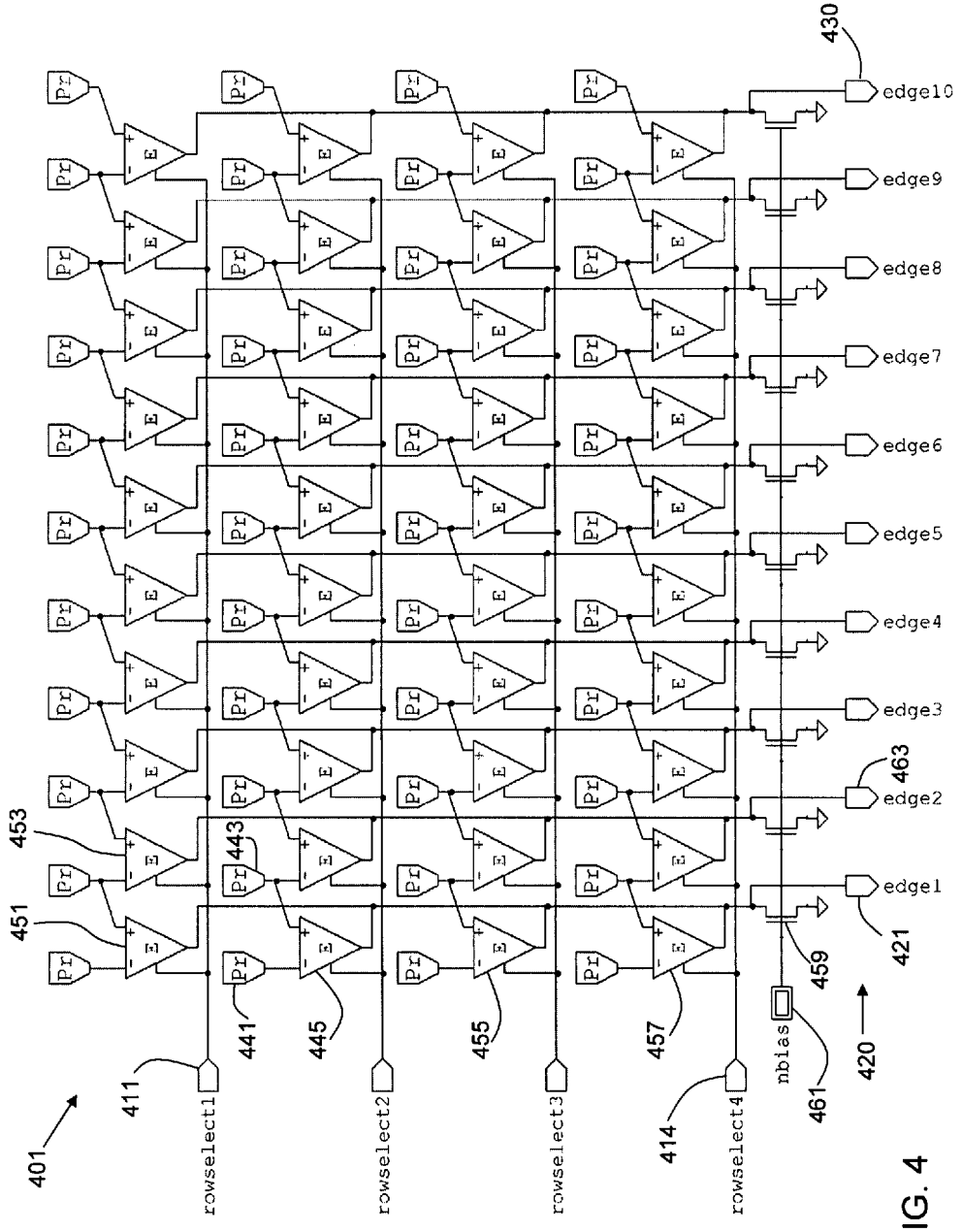
FIG. 4 illustrates an exemplary focal plane circuit.

A focal plane circuit is any circuit that may lie at an image formed by an optical apparatus and generates an array of photoreceptor signals based on the image, and generates signals based on the photoreceptor signals. A focal plane circuit may also be referred to as a focal plane array. Refer to FIG. 4, which illustrates an exemplary focal plane circuit 401. For purposes of discussion, this focal plane circuit 401 is drawn as having an array of four rows and eleven columns. This exemplary circuit has an array four digital row select inputs rowselect1 411 through rowselect4 414. This exemplary circuit also has an array 420 of ten analog edge signal nodes edge1 421 through edge10 430. This exemplary circuit also has a four-by-eleven array of photoreceptor circuits from FIG. 2A and a four-by-ten array of edge detector circuits from FIG. 3A arranged and connected as shown in FIG. 4. Each individual edge detector circuit receives as analog inputs the outputs of two adjacent photoreceptors. For example, as shown in the exemplary circuit of FIG. 4, the output of photoreceptor 441 is connected to the inn 305 input of edge detector circuit 445, while the output of photoreceptor 443 is connected to the inp 303 input of edge detector circuit 445. This connectivity pattern is repeated across the entire focal plane circuit 401.

In the illustrated embodiment, all of the edge detector circuits in a row have their respective row select inputs 307 connected to the same row select line. For example, the row select inputs of edge detector circuits 451 and 453, and all other edge detector circuits on the top row, are connected to the digital line rowselect1 411.

In the illustrated embodiment, all of the edge detector circuits in a column have their respective output nodes out 365 connected together to the same edge signal node. Each edge signal node is also connected to an N-channel transistor, called a "column readout transistor", which serves as a current source for an entire column of edge detector circuits. For example, in the illustrated embodiment the outputs of edge detectors 451, 445, 455, and 457 are all connected to the same edge signal node edge1 421, and node edge1 421 is also connected to column readout transistor 459. All of the column readout transistors have their gates connected to a common global node nbias 461, which is set to a voltage sufficiently positive for the column readout transistors to turn on and operate in the saturated mode.

The focal plane circuit 401 in the illustrated embodiment operates as follows. As light strikes the focal plane circuit 401, the exemplary photoreceptor circuits generate corresponding photoreceptor signals that are provided to the edge detector circuits. The differential amplifier 317 of each edge detector circuit computes the difference between the edge detector's two input photoreceptor signals. This implements an "edge detector" function that will be familiar to persons skilled in the art of image processing. The capacitor 351 and OTA 341 of each edge detector circuit then computes a time domain high passed version of this difference. All of the exemplary photoreceptor circuits and exemplary edge detector circuits in the focal plane circuit 401 operate similarly and in parallel, so that the node hp 347 of each edge detector circuit is ready to be read out if rowselect 307 is set high.

The edge detector circuit outputs in the illustrated embodiment are read out as follows: When one of the rowselect lines is turned high, its corresponding row of edge detector circuits is connected to the edge signal nodes 420. For example, when rowselect1 411 is high, edge detector 451 is connected to edge signal node edge1 421 and edge detector 453 is connected to edge output node edge2 463. No more than one of the rowselect lines should be high at one time in the illustrated embodiment. When an edge detector circuit's rowselect input 307 is set to digital "high", it is said that the edge detector is "selected". When an edge detector circuit is so selected, its internal transistors 361 and 363 plus the column readout transistor from the bottom of FIG. 4 form a source follower circuit, whereby the output voltage follows that of the edge detector's node hp 347. In this manner, the hp 347 signals of an entire row of edge detectors are placed onto the edge signal nodes 420.

Note that although the focal plane circuit 401 in the illustrated embodiment is described as having four rows of eleven exemplary photoreceptor circuits and four rows of ten edge detector circuits generating a total of ten edge signals, the actual size of the array may be practically any size. Larger array sizes will allow a higher resolution images and a higher number of optical flow measurements to be obtained. Note also that the exemplary focal plane circuit 401 of FIG. 4 depicts one of many possible architectures for constructing a focal plane circuit comprising photoreceptor circuits and edge detector circuits. Note that a focal plane circuit may be realized using any other implementations known in the art and the description presented herein is for illustration purposes and does not limit the scope of the present teaching.

Figures 5A, 5B:
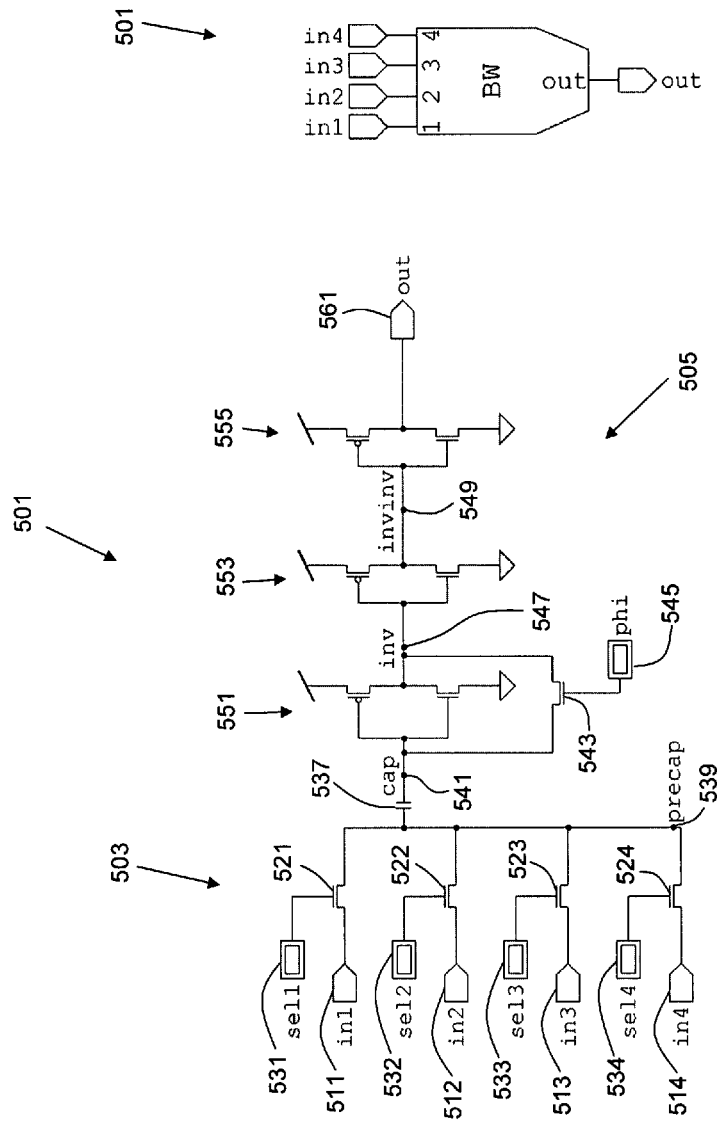
FIG. 5A illustrates an exemplary binary generator circuit.
FIG. 5B illustrates an exemplary schematic symbol used to signify a binary generator circuit.

In the illustrated embodiment, the function of a binary generator circuit is to receive as input one or more edge signals, or other substantially analog inputs, and generate a binary value based on the edge signals. Refer to FIG. 5A, which illustrates an exemplary binary generator circuit 501.

The first section of the exemplary binary generator circuit 501 is the input section 503, which comprises four analog inputs in1 511 through in4 514, four input transistors 521 through 524, four global switch signals sel1 531 through sel4 534, and a capacitor 537. The input section 503 is arranged as shown in the figure so that one of the analog inputs may be connected to capacitor 537 at node precap 539. The switch signals sel1 531 through sel4 534 determine the input to which capacitor 537 is connected. For example, when switch signal sel1 531 is high, and the other three switch signals sel2 532 through sel4 534 are low, node precap 539 is connected to input in1 511 via transistor 521. In this case, it is said that "capacitor 537 is connected to input in1 511".

The second section of the exemplary binary generator circuit 501 is the inverter section 505, which comprises three inverters 551, 553, and 555. Each inverter may be formed from a P-transistor and an N-transistor as shown in FIG. 5A. The inverters may also equal to each other in terms of the geometries of their respective P- and N-transistors. The input of inverter 551 is connected to the right-hand side of capacitor 537 at node cap 541. The input and output of inverter 551 may be shorted together with transistor 543, which occurs whenever global node phi 545 is set to digital high. The output of inverter 551 provides the input to inverter 553 at node inv 547. The output of inverter 553 provides the input to inverter 555 at node ininv 549. The output of inverter 555 becomes output node out 561.

Note that the input section 503 and inverter section 505 together form a switched capacitor circuit that may be used to compare the potential of one analog input with another. This is because capacitor 537 may be "switched" from one input to another. The switched capacitor circuit may be also referred to as a flash comparator circuit. The circuit 501 is one of many possible switched capacitor circuits that may be implemented. The exemplary binary generator circuit 501 may be operated as follows:

First, signal phi 545 is set to digital high, thus closing transistor 543 and shorting together the input and output of inverter 551. When this happens, nodes cap 541 and inv 547 settle to a value between Ground 103 and the Power 104 which will be referred to as the "middle voltage" or "Vmid".

Second, one of the four input global switch signals is set to a digital high. As an example, suppose the global node sel1 531 is set high, connecting node precap 539 to input in1 511. Suppose that the potential at node in1 511 is the value Vin1. The voltage across capacitor 537, defined as the potential at node cap 541 minus the potential at node precap 539, will equal the value "Vmid−Vin1".

Third, signal phi 545 is set to digital low, which opens transistor 543 so that the input and output of inverter 551 are no longer shorted together. This also causes node cap 541, on the right-hand side of capacitor 537, to float. In this state the potential across the capacitor does not substantially change and thus remains approximately equal to "Vmid−Vin1". Small deviations from this value may be possible as a result of injection charge from transistor 543 switching off, however this injection charge may be minimized by implementing transistor 543 to have a small gate area, by increasing the size of capacitor 537, and/or by using a pass-gate in place of transistor 543.

Fourth, the currently high global switch signal is turned off, and at the same time (or shortly thereafter) another global switch signal is turned on. To continue the example, suppose global switch signal sel1 531 is turned low, and then global switch signal sel2 532 is turned high. This would connect the capacitor 537 to input in2 512. Because the potential across capacitor 537 is still "Vmid−Vin1", the voltage at node cap 541 will now become:

$$Vcap=Vin2+(Vmid-Vin1)=Vmid+(Vin2-Vin1).$$

Suppose the potential at input in2 512 is more positive than the potential at input in1 511. Then (Vin2−Vin1) is a positive number. This causes the potential at the input of inverter 551 at node cap 541 to be greater than Vmid. This causes node inv 547 at the output of inverter 551 to have a potential significantly less positive than Vmid. This in turn causes the node invinv 549 to have a high digital value, and the node out 561 to have a low digital value.

Now suppose the potential at input in2 512 is less positive than the potential at input in1 511. Then (Vin2−Vin1) is a negative number. This causes the potential at the input of inverter 551 at node cap 541 to be less than Vmid, which in turn causes inverter 551 to output at node inv 547 a potential significantly higher than Vmid. The result is that node invinv 549 will have a low digital value, and the node out 561 will have a high digital value.

When the exemplary binary generator circuit 501 is operated as such, the node out 561 will have a digital high value when Vin1>Vin2 and a digital low value when Vin1<Vin2. In the case of Vin1=Vin2, factors such as noise, mismatch between transistors, injection charge in transistor 543, and parasitic capacitance will generally cause the circuit 501 to tend towards either that of Vin1>Vin2 or Vin1<Vin2.

Above we demonstrated how the exemplary binary generator circuit 501 may be used to compare the voltage at input in2 512 with that of in1 511. In the case of the above example, it can be said that the binary generator circuit 501 generates an output using the function "output 1 if Vin1>Vin2, and output 0 otherwise". This function may be referred to as a "binarization function". By properly closing different input transistors in sequence, it is possible to compare any one of the four input signals with any other and thus implement other binarization functions. For example, the binary generator circuit 501 may instead be operated to compute the binarization function "output 1 if Vin3>Vin2, and output 0 otherwise". The binary generator circuit may thus be operated, or "reconfigured" to generate a binary value according to a variety different binarization functions. Because of this, the circuit 501 may also be referred to as a "reconfigurable binary generator circuit".

If the input signals to the binary generator circuit 501 are edge signals, for example edge signals generated by the exemplary focal plane circuit 401, then the signal at the output node out 561 may be referred to as a "binarized edge signal".

FIG. 5B illustrates an exemplary schematic symbol used to signify a binary generator circuit 501, including the location of the inputs in1 511 through in4 514 and the output out 561.

The binary generator circuit 501 shown in FIG. 5A is one of many realizations of binary generator circuit that may generate a binary value based on one or more analog inputs. Any circuit that may be configured to generate one or more binary values based on one or more analog inputs may be referred to as a binary generator circuit. Furthermore, the circuit 501 is one of many realizations of a reconfigurable binary generator circuit that may be reconfigured to generate at least one binary value based on a selectable binarization function. Any circuit that may be reconfigured to generate one or more binary values based on one or more analog inputs according to a selectable binarization function may be referred to as a reconfigurable binary generator circuit. Note that a binary generator circuit or a reconfigurable binary generator circuit may be realized using any other implementations known in the art and the description presented herein is for illustration purposes and does not limit the scope of the present teaching.

The binary generator circuit 501 shown in FIG. 5 is also one of many realizations of a switched capacitor circuit that may be used to generate a binary value based on one or more analog inputs. A switched capacitor circuit is defined hereinafter as any circuit with the following two characteristics: 1) a switched capacitor circuit comprises at least one amplifier or inverter and a network of capacitors and switches, including when the switches are implemented with transistors or pass-gates, and 2) a switched capacitor circuit has the ability to generate one or more output signals based on one or more input signals by using the switches to change how the capacitors are connected in the network. For example, the binary generator circuit 501 is able to compute whether Vin2>Vin3 by reconnecting the capacitor 537 from input in2 512 to in3 513 using switching transistors 522 and 523. Any switched capacitor that is able to generate a binary output based on one or more analog inputs may be used as a binary generator circuit. Note that a switched capacitor circuit may be realized using any other implementations known in the art and the description presented herein is for illustration purposes and does not limit the scope of the present teaching.

Figure 6:
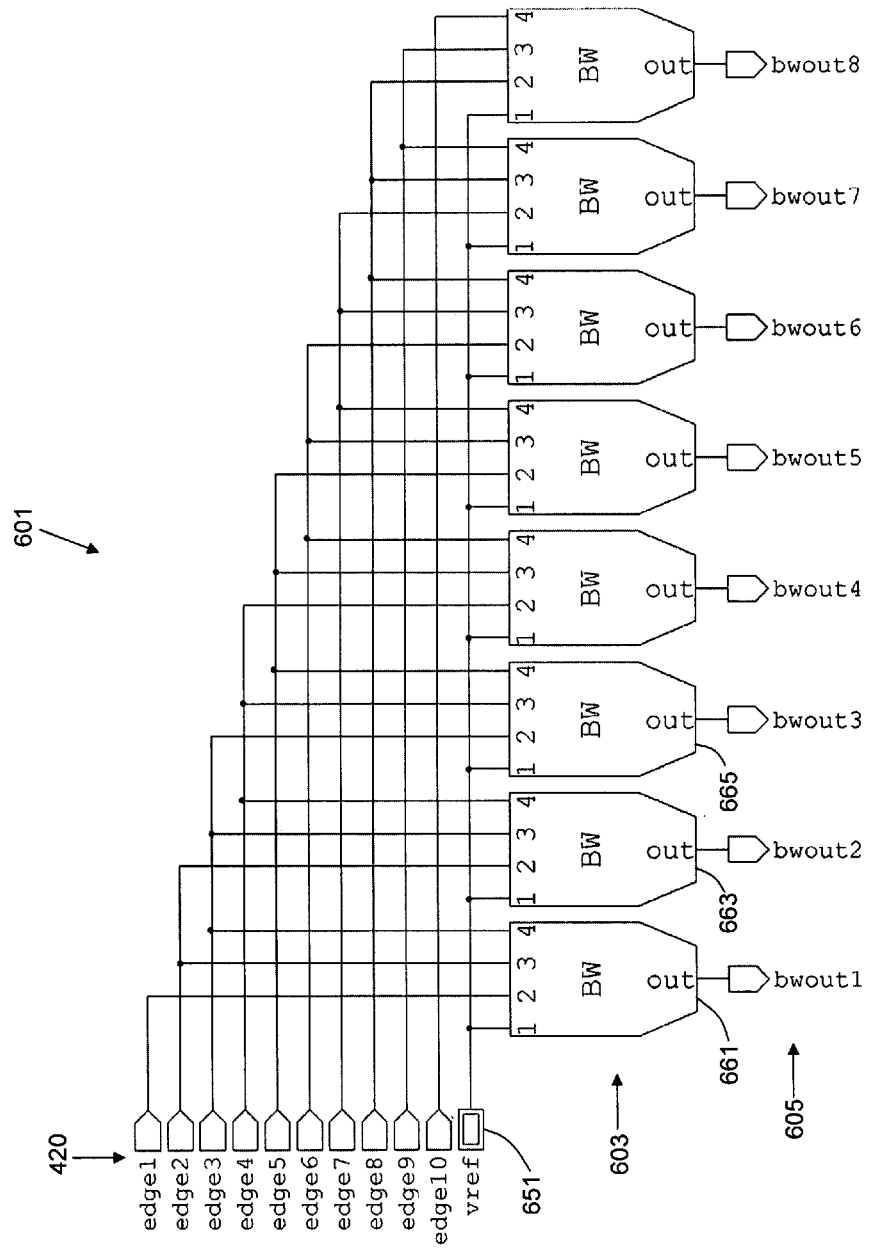
FIG. 6 illustrates an exemplary binary generator array.

A binary generator array is an array of binary generator circuits configured to generate an array of binary signals based on an array of edge signals (or other analog signals). Refer to FIG. 6, illustrates an exemplary binary generator array 601 that generates eight binary values based on ten analog edge signals. This circuit receives as input the ten edge signals 420 of FIG. 4, and provides them to an array 603 of eight binary generator circuits. The outputs 605 bwout1 through bwout8 of the eight binary generator circuits 603 are thus binarized edge signals and form the eight bit output of the binary generator array 601. The eight binary generator circuits 603 are connected to the inputs 420 as follows:

First, input in1 511 of every binary generator circuit in the exemplary binary generator array 601 is connected to a common global node vref 651. This enables the comparison of edge signals to a reference voltage, if this is so desired.

Second, the binary generator circuits in the exemplary binary generator array 601 are connected in a staggered pattern. Inputs in2, in3, and in4 from binary generator circuit 661 are respectively connected to edge signals edge1, edge2, and edge3. Inputs in2, in3, and in4 from binary generator 663 are respectively connected to edge signals edge2, edge3, and edge4. Inputs in2, in3, and in4 from binary generator 665 are respectively connected to edge signals edge3, edge4, and edge5. The remaining binary generator circuits are similarly connected, as shown in FIG. 6. Larger or smaller binary generator arrays having more or fewer binary generator circuits may be similarly constructed.

The function of the exemplary binary generator array 601 is to take as an input the ten edge signals 420 edge1 through edge10 and generate eight binarized edge signals 605 bwout1 through bwout8 based on the ten input signals 420 in a manner selected through usage of the global switch signals 531 through 534. Suppose that the binary generator global signals are driven so that the binarization function computed in the binary generator circuits is "output 1 if Vin3>Vin2, and output 0 otherwise". Suppose that the values of the ten edge signals 420 are as follows:

edge1 potential=2.0 Volts
edge2 potential=2.5 Volts
edge3 potential=3.0 Volts
edge4 potential=2.5 Volts
edge5 potential=2.0 Volts
edge6 potential=1.5 Volts
edge7 potential=2.5 Volts
edge8 potential=3.0 Volts
edge9 potential=3.5 Volts
edge10 potential=2.5 Volts The binary pattern contained by output signals bwout1 through bwout8 will be 11000111 (with bwout1 equalling digital "1" and having the left-hand position in this word), since edge2>edge1, edge3>edge2, edge4<edge3 and so on.

The exemplary binary generator array 601 shown in FIG. 6 is one of many realizations of a binary generator array that may generate an array of binary values based on analog inputs. Any circuit that may be configured to generate an array of binary values based on an array of analog inputs may be referred to as a binary generator array. This includes any binary generator arrays that are not themselves constructed from an array of binary generator circuits. Furthermore, the circuit 601 is one of many realizations of a reconfigurable binary generator array that may be reconfigured to generate an array of binary values according to a selectable binarization function. Any circuit that may be reconfigured to generate an array of binary values based on one or more analog inputs according to a selectable binarization function may be referred to as a reconfigurable binary generator array. Note that a circuit for generating an array of binary values based on an array of input analog signals may be realized using any other implementations known in the art and the description presented herein is for illustration purposes and does not limit the scope of the present teaching.

Figure 7:
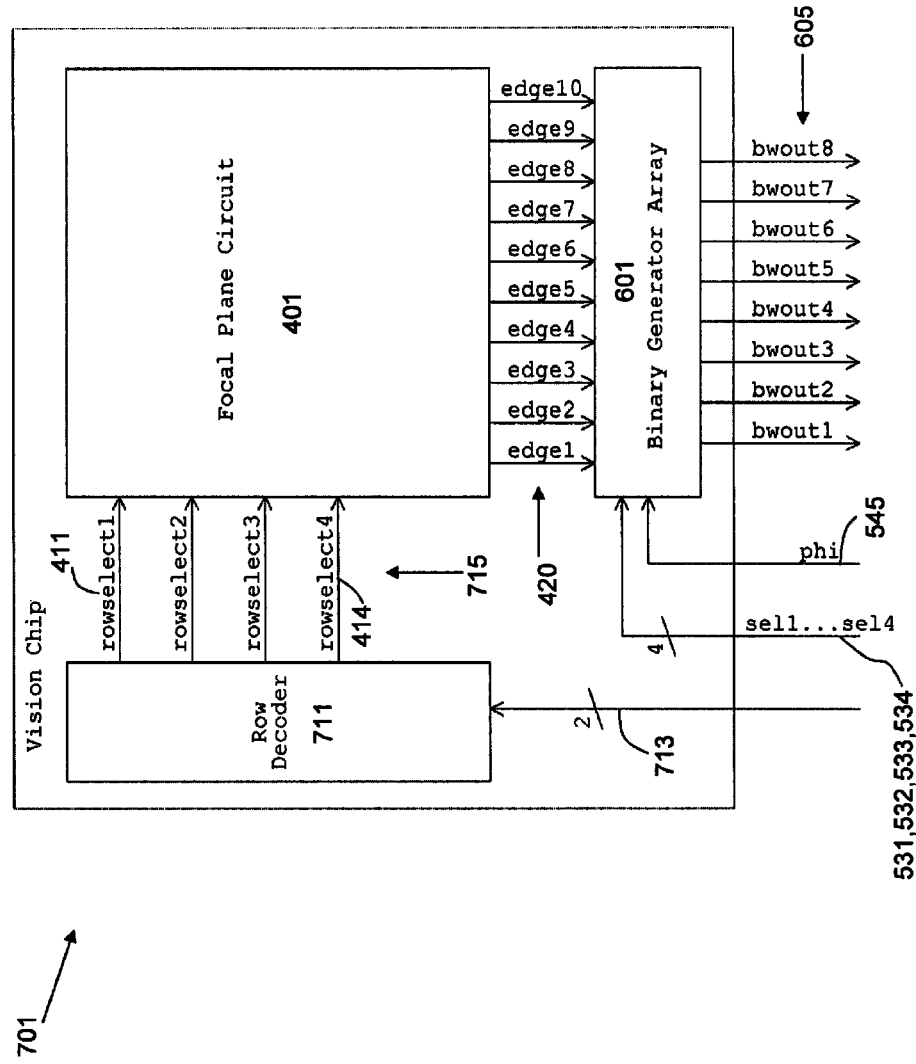
FIG. 7 illustrates the schematic of an exemplary edge detecting vision chip.

Refer to FIG. 7, which illustrates the schematic of an exemplary edge detecting vision chip 701. As described above, a vision chip is an imaging chip having both photoreceptor circuits and image processing circuits on the same die. A vision chip may be mounted at a position with respect to an optical assembly, such as a lens, to grab an image from a field of view visible by the optical assembly and the vision chip.

The exemplary edge detecting vision chip 701 comprises three elements, a row decoder circuit 711, the focal plane circuit 401 of FIG. 4, and the reconfigurable binary generator array 601 of FIG. 6. The row decoder circuit 711 receives as input a two-bit row command signal 713 and generates the array of row select signals rowselect1 411 through rowselect4 414 based on the row command signal 713. The focal plane circuit receives as input the row select signals rowselect1 411 through rowselect4 414 and generates as an output the array of edge signals 420. The reconfigurable binary generator array 601 receives as input the array of edge detector signals 420 and generates an array of binarized edge signals 605. The reconfigurable binary generator array 601 also receives as input the switch signals sel1 531 through sel4 534 and the signal phi 545.

In the exemplary edge detecting vision chip 701 the row command signal 713 contains an index number to select an individual row. For example the pattern "00" may indicate that rowselect1 is turned on, "01" may indicated that rowselect2 is turned on, and so forth. The row decoder 711 may be implemented with a decoder circuit.

The exemplary edge detecting vision chip 701 may be modified by changing the size of the arrays or by utilizing different versions of photoreceptor circuits, edge detector circuits, and/or reconfigurable binary generator arrays.

The exemplary edge detecting vision chip 701 may be operated to generate an array of binarized edge signals for each row of the focal plane circuit 401. First row command signal 713 is set so that rowselect1 411 is set high to select the first row of the focal plane circuit 401. Then the reconfigurable binary generator array 601 is operated to generate binarized edge signals based on the edge signals from the first row. Then the second row of the focal plane circuit 401 is selected, and an array of binarized edge signals is generated based on the second row's edge signals. The remaining rows of the focal plane circuit 401 may be processed in this manner. The resulting binarized edge signals from all four rows form a two dimensional array of binary values that may be referred to as a binarized image. Another binarized image may be generated by operating the reconfigurable binary generator array 601 to implement a different binarization function. A collection of binarized images generated using different binarization functions may also collectively be referred to as a binarized image.

Note that an edge detecting vision chip may be realized using any other implementations known in the art and the description presented herein is for illustration purposes and does not limit the scope of the present teaching.

Figure 8:
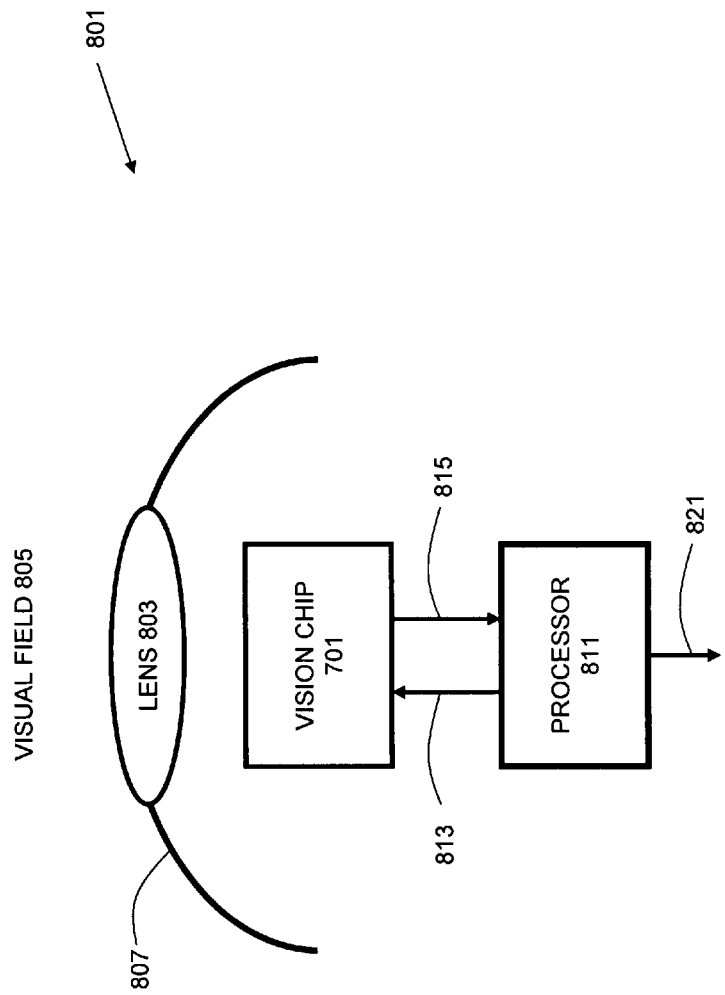
FIG. 8 illustrates an exemplary machine vision system incorporating an edge detecting vision chip.

Refer to FIG. 8, which illustrates an exemplary machine vision system 801 incorporating the exemplary edge detecting vision chip 701 of FIG. 7. A machine vision system is defined as any system that grabs an image based on the environment, processes the image, and generates an output based on the grabbed image. A lens 803 or another optical apparatus (such as a pinhole, mirror, or lens assembly) may be used to focus light from the visual field 805 to form an image on the vision chip 701. The visual field 805 is defined as the region of the environment that is visible by the vision chip 701 as a result of the position of the vision chip 701 and the lens 803 and the size of the vision chip 701. The lens 803 or other optical apparatus may be supported by an optical enclosure 807 which holds the lens 803 at a predetermined distance from the vision chip 701 and prevents stray light from striking the vision chip 701. A processor 811 is electrically connected to the vision chip 701. A set of electrical signals 813 is generated by the processor 811 and sent to the vision chip 701. These signals 813 may include row command signals 713, switch signals sel1 531 through sel4 534, and the signal phi 545. The processor 811 may also receive signals 815 from the vision chip 701, which may include the binarized edge signals 605 or a binarized image generated by the reconfigurable binary generator array 601. The processor 811 may be programmed to generate an output 821 based on the data generated by the vision chip 701. If the processor 811 is programmed to sense visual motion and/or optical flow, and generate measurements based on the visual motion and/or optical flow, then the machine vision system 801 may be referred to as an optical flow sensor.

The processor 811 may be a microcontroller, a digital signal processor (DSP), a microprocessor, or any other device that processes information. The processor may be a device that generates switch signals sel1 531 through sel4 534 and phi 545, and generates a digital signal or set of digital signals based on the vision chip output. The processor may optionally be embedded on the vision chip 701.

The bias signals prsupply 213, dabias 319, hplevel 343, hpbias 345, nbias 461, vref 651, and any other required bias signals may be generated on or off the vision chip 701, and may be generated using a resistor network or any other appropriate bias voltage generator. Note that a machine vision system incorporating a vision chip may be realized using any other implementations known in the art and the description presented herein is for illustration purposes and does not limit the scope of the present teaching.

An exemplary embodiment of an optical flow sensor is the machine vision system 801 of FIG. 8, with the processor 811 programmed with an algorithm enabling it to compute one or more optical flow measurements based on motion in the visual field 805. Essentially this algorithm monitors the binarized image generated by the vision chip 701 over time and generates optical flow measurements based on any motion. This binarized image contains digital ones and zeros corresponding to the placement of visual edges in the visual field 805, and thus motion in the visual field will produce corresponding motion in the binarized image.

If the visual motion is to the right, the binary values in the binarized image will move to the right, and vice versa. Those having a skill in the art of image processing will be able to write a program that tracks the motion of these high values, and thus compute optical flow from the binarized image. An exemplary algorithm for computing optical flow measurements based on the binarized image is presented next:

Exemplary Algorithm for an Optical Flow Sensor

This exemplary algorithm generates optical flow measurements by implementing "elementary motion detectors" (EMDs) across an entire row of binary outputs. A single EMD receives a three bit wide input array and monitors the motion of digital high values across its width. For example, suppose the binarized edge signals 605 for one row holds the values 00100001 at one time instant, then holds the values 01000010 at a later time instant, and then holds the values 10000001 at a final time instant. An EMD located at the left-hand side of the array will see these three bits change from 100 to 010 and then to 100. When the pattern 100 is reached the EMD will observe that the digital high value has moved right to left over a distance of two pixels. The time required to travel this distance is divided into two pixels to generate a "velocity report". The velocity report is provided with a sign to indicate whether motion is right-to-left or vice versa. Such velocity reports are generated by an EMD whenever they observe a high bit move entirely across the EMDs input array. Continuing this example, another EMD located at the right-hand side of the array will see the sequence 001, 010, and 001. Since the high bit did not move across the entire array, this EMD will not generate a velocity report. A total of six three-bit wide EMDs may thus be placed across an eight-bit array.

In the first exemplary optical flow algorithm, an EMD may be implemented with a state machine and a timer. The timer measures how much time was required for the digital high value to move across the EMDs width. The state machine is configured to track the motion of the digital high value across the array, operate the timer, and signal when a velocity report is to be generated. The state machine also indicates the direction associated with the velocity report.

As texture moves across the visual field, the EMDs will generally create velocity reports that correspond to the current optical flow. These individual velocity reports are then "fused" to create a final optical flow measurement. The simplest method of fusion is to use a running average that is updated every time a new velocity report is created. The impact of "bad" velocity reports is mitigated. The reader will recognize that the algorithm just summarized is similar to those algorithms in my U.S. Pat. Nos. 6,020,953 and 6,384,905.

For clarity, the first exemplary algorithm implemented on the processor is written in a pseudo code based on the MATLAB programming language. Each instruction is preceded by a "line number" of the format of the letter "C" followed by three digits. These line numbers are used here to facilitate the subsequent discussion of how the program operates. This program can be easily adapted to different programming languages, and can be modified for vision chips having different array sizes. The algorithm is listed next.

```
C001:  x = -99;
C002:  StateMatrix = [
              5 3 2 x 1 1 x x
              5 3 2 x 1 3 x x
              5 3 4 x 1 3 x x
              5 3 4 x 1 1 x x
              5 3 5 x 1 5 x x
       ];
C003:  TimerMatrix = [
              0 0 1 x 1 0 x x
              0 0 1 x 0 0 x x
              0 1 1 x 0 0 x x
              0 0 1 x 0 0 x x
              0 1 0 x 1 0 x x
       ];
```

```
C004:   OutputMatrix = [
            0 0 0 x 0 0 x x
            0 1 0 x 0 0 x x
            0 0 0 x 0 0 x x
            0 0 0 x -1 0 x x
            0 0 0 x 0 0 x x
        ];
C005:   InitialState = 5;
C006:   FieldMatrix = [
            1 1 1 1 1 1 0 0
            2 2 2 2 2 2 0 0
            3 3 3 3 3 3 0 0
            4 4 4 4 4 4 0 0
        ];
C010:   Rows = 4;
C011:   Columns = 8;
C012:   Fields = 4;
C013:   AnaFeatures = 2;
C014:   DigFeatures = 2;
C015:   FieldAverage = zeros(1,4);
C020:   timeval = 0;
C021:   State = ones (Rows,Columns,AnaFeatures,DigFeatures)*InitialState;
C022:   Timer = zeros (Rows,Columns,AnaFeatures,DigFeatures);
C023:   alpha = 0.02;
C030:   SEL1 = 0;
C031:   SEL2 = 0;
C032:   SEL3 = 0;
C033:   SEL4 = 0;
C100:   while (1)
C101:       VelocityReport = zeros (Rows,Columns,AnaFeatures,DigFeatures);
C102:       for row = 1:Rows
C103:           for feat = 1:AnaFeatures
C104:               if feat==1
C110:                   ROWPORT = row - 1;
C111:                   PHI = 1;
C112:                   SEL2 = 1;
C113:                   SEL3 = SEL4 = 0;
C114:                   DelayOneMicrosecond(1);
C115:                   PHI = 0;
C116:                   SEL2 = 0;
C117:                   SEL3 = 1;
C118:                   DelayOneMicrosecond(1);
C119:                   bwin = BWOUT;
C121:                   bwf10 = [bwin(1:Columns-1) & ~bwin(2:Columns) ];
C122:                   bwf01 = [~bwin(1:Columns-1) & bwin(2:Columns) ];
C123:               else
C130:                   ROWPORT = row - 1;
C131:                   PHI = 1;
C132:                   SEL2 = 1;
C133:                   SEL3 = SEL4 = 0;
C134:                   DelayOneMicrosecond(1);
C135:                   PHI = 0;
C136:                   SEL2 = 0;
C137:                   SEL4 = 1;
C138:                   DelayOneMicrosecond(1);
C139:                   bwin = BWOUT;
C141:                   bwf10 = [bwin(1:Columns-1) & ~bwin(2:Columns) ];
C142:                   bwf01 = [~bwin(1:Columns-1) & bwin(2:Columns) ];
C143:               end
C200:               for column = 1:Columns-1
C201:                   if FieldMatrix(row,column) > 0
C202:                       threebits = bwf01(column:column+2);
C203:                       emdin = 4*threebits(1) + 2*threebits(2) +
                                threebits(3) + 1;
C204:                       oldstate = State(row,column,feat,1);
C205:                       State(row,column,feat,1) =
                                StateMatrix(oldstate,emdin);
C206:                       if OutputMatrix(oldstate,emdin) == 1
C207:                           VelocityReport(row,column,feat,1) = 2 /
                                    Timer(row,column,feat,1);
C209:                       elseif OutputMatrix(oldstate,emdin) == -1
C210:                           VelocityReport(row,column,feat,1) = -2 /
                                    Timer(row,column,feat,1);
C212:                       end
C213:                       if TimerMatrix(oldstate,emdin) == 1
C214:                           Timer(row,column,feat,1) =
                                    Timer(row,column,feat,1)+1;
C215:                       else
C216:                           Timer(row,column,feat,1) = 1;
C217:                       end
```

```
C218:       end
C220:       if VelocityReport(row,column,feat,1) ~= 0
C221:           field = FieldMatrix(row,column);
C222:           FieldAverage(field) = FieldAverage(field) +
                    alpha *
                    (VelocityReport(row,column,feat,1)
                    - FieldAverage(field));
C223:       end
C301:       if FieldMatrix(row,column) > 0
C302:           threebits = bwf10(column:column+2);
C303:           emdin = 4*threebits(1) + 2*threebits(2) +
                    threebits(3) + 1;
C304:           oldstate = State(row,column,feat,2);
C305:           State(row,column,feat,2) =
                    StateMatrix(oldstate,emdin);
C306:           if OutputMatrix(oldstate,emdin) == 1
C307:               VelocityReport(row,column,feat,2) = 2 /
                        Timer(row,column,feat,2);
C308:           elseif OutputMatrix(oldstate,emdin) == -1
C310:               VelocityReport(row,column,feat,2) = -2 /
                        Timer(row,column,feat,2);
C312:           end
C313:           if TimerMatrix(oldstate,emdin) == 1
C314:               Timer(row,column,feat,2) =
                        Timer(row,column,feat,2)+1;
C315:           else
C316:               Timer(row,column,feat,2) = 1;
C317:           end
C318:       end
C319:       if VelocityReport(row,column,feat,2) ~= 0
C320:           field = FieldMatrix(row,column);
C321:           FieldAverage(field) = FieldAverage(field) +
                    alpha *
                    (VelocityReport(row,column,feat,2)
                    - FieldAverage(field) );
C322:       end
C340:     end
C341:   end
C342: end
C350: <<< Insert interface code here >>>
C399: end
```

The operation of the above exemplary algorithm is described next. Program lines are referenced by the notation C### where ### is a three-digit number.

Lines C001 through C005, set up state machine: These lines set up state machine matrices that define how an EMD responds to inputs. Each matrix has five rows and eight columns, which correspond to five possible states of the state machine and eight possible input permutations of three-bit words (000, 001, 010, . . . , 110, 111). For indexing columns of these matrices, the three-bit input pattern maps onto the integer value represented by the three-bit word plus one. Thus when the binary input word is 000, the column index is 1. When the binary input word is 001, the column index is 2. When the binary input word is 010, the column index is 3, and so on. For indexing rows of these matrices, the three-bit state maps directly onto the three-bit word, i.e. state 1 is 001, state 2 is 010, etc.

The matrix StateMatrix defines the new state that results from the old state and the current input. Therefore if the current state of the EMD is 3, and the input is 100, which corresponds to an input value or column index of 5, the new state is 1, as found in the third row and fifth column of this matrix. The matrix TimerMatrix dictates what to do with the timer value of each EMD, with 1 indicating that the timer is incremented and 0 indicating that the timer is reset. The matrix OutputMatrix indicates whether or not the EMD generates a velocity report. A value of 1 indicates that the EMD should generate a velocity report in the positive direction, a value of −1 indicates a velocity report in the negative direction, and a value of 0 indicates that no velocity report is generated. Line C005 dictates that the default or initial state of the EMD is state 5.

As will be made clear below, input patterns having two adjacent ones (011, 110, and 111) will not be considered. The value x=−99 (defined in line C001) is arbitrarily chosen and is used to account for these "never occurring" inputs.

Lines C006 through C014, EMD array dimensions and motion sensing fields: The variable Rows contains the number of rows in the exemplary focal plane circuit 401. The variable Columns contains the number of binary outputs 605 generated by the exemplary reconfigurable binary generator array 601 based on one row of the exemplary focal plane circuit 401 and one binarization function.

The variable Fields contains the number of "motion sensing fields" defined. Each motion sensing field generates one optical flow measurement. The purpose of motion sensing fields is to divide up the entire focal plane into multiple regions, each producing its own optical flow measurement. According to line C006, the focal plane is divided into four regions arranged in a 4-by-1 array. Other arrangements of dividing the focal plane into motion sensing fields are possible. The three right-most columns are assigned to motion sensing field "zero". This will indicate to the program that EMDs should not be computed at these locations, because there are not enough bits to form a three-bit word input to an EMD.

Variables AnaFeatures and DigFeatures respectively denote the number of analog features that will be computed across the focal plane array 401 and the number of metafeatures that will be computed. Metafeatures are computed in lines C121, C122, C141, and C142 and will be described below. An analog feature is another name for the analog portion of a binarization function that is implemented, for example a binarization function computed based on Vin3>Vin2 makes use of the analog value Vin3−Vin2. The variable AnaFeatures thus contains the number of different binarization functions that will be performed on the edge signals.

Lines C015 through C023, initialization: The matrix variable FieldAverage stores the running average optical flow measurement of each field, which is initially set to zero for each field. The matrix variable Timer stores a time elapsed value for each EMD. In this implementation, time is divided up into "frames". The matrix variable State records the state of each EMD, and is initialized to the default state defined in line C005. The variable alpha is a running average update rate used for updating FieldAverage in response to new velocity reports. Alpha is used in command line C321. A higher value of alpha results in the running averages adapting at a faster rate.

Lines C030 through C033, initialize global switch signals on exemplary vision chip 701. Commands C030 through C033 respectively set the global switch signals sel1 531, sel2 532, sel3 533, and sel4 534 to their initial values. It is assumed that the processor 811 is connected to the exemplary vision chip 701 and configured such that setting program variables SEL1 through SEL4 sets the respective switch signals accordingly.

Line C100 through C103, begin loops for computing optical flow. Line C100 begins the loop (ending at line C399) that begins optical flow computation. The completion of one loop is the completion of one "frame" in which all rows of the exemplary focal plane circuit 401 are grabbed and processed with two (the value of AnaFeatures) different binarization functions. The matrix VelocityReport stores the velocity reports that may be generated in a frame, and is initialized at the beginning of a frame at line C101. Note that in this exemplary embodiment, the value "zero" for a velocity report signifies the lack of a velocity report. Line C102 begins a loop (ending at line C342) that cycles through the four rows of the exemplary focal plane circuit 401. Line C103 begins a loop (ending at line C341) that cycles through two binarization functions to be computed.

Lines C104 through C119, for the first binarization function, select one row of focal plane circuit 401, operate reconfigurable binary generator array 601, and grab resulting binarized edge signals 605. Line C110 indicates to the decoder 711 which row is to be selected. This causes the decoder 711 to turn on the appropriate row select line. Lines C111 through C119 generate digital signals to drive the appropriate global nodes sel2 532, sel3 533, and phi 545 and implement the binarization function "output 1 if Vin3>Vin2, and output 0 otherwise". This causes the exemplary binary generator circuits to compare adjacent edge signals. To enable this to occur, in the illustrated embodiment the processor 811 is configured to modify phi 545 and the row command signals 713 respectively when the variables PHI and ROWPORT are modified.

Lines C114 and C118 each cause the program to delay for one microsecond. This allows the circuitry on the exemplary vision chip 701 to settle after transistors are switched on and off. The ideal delay may be more or less, depending on the process and transistor geometries used to fabricate the exemplary vision chip 701.

Line C119 is where the binarized edge signals 605 are read from the exemplary vision chip 701 into the processor 811 and stored in the array bwin. It is assumed that the processor 811 is connected to the exemplary vision chip 701 and configured so that the variable BWOUT contains the binarized edge signals 605.

In the above program, the elements of the array bwin form one row of a binarized image read out from the vision chip 701, with multiple rows read out in the loops starting with lines C102 and C103. The contents of bwin from each reading may be stored in a larger matrix to form a binarized image. The performing of steps C104 through C119 over one or more rows and/or features of the focal plane circuit 401 may be referred to as "grabbing a binarized image".

Lines C121 and C122, compute metafeature signals for the binarized edge signals computed using the first binarization function. These two lines compute metafeature signals from the binarized edge detector signals in bwin. A "01" metafeature occurs when one element of bwin is digital zero and the element immediately to its right is digital one. A "10" metafeature occurs when one element of bwin is digital one and the element immediately to its right is digital zero. When the desired metafeature is detected, the resulting metafeature signal is set to the digital value 1. The metafeature signal is set to 0 otherwise.

With this method, the 8-bit array bwin is used to generate a 7-bit array bwf01 and bwf10. For example, if bwin contains the array "00110010", then bwf01 will contain the array "0100010" and bwf10 will contain the array "0001001". Note that in the above exemplary algorithm the arrays bwf01 and bwf10 will both have the characteristic that two adjacent bits are never digital high at the same time.

In the above program, metafeature signals are generated using an "and-not" operation. For example, for a two-bit binary word AB, the metafeature signal for a "10" metafeature would be "A and not-B", while the metafeature signal for a "01" metafeature would be "B and not-A". Therefore such metafeatures may clearly be computed using simple digital logic comprising inverters and-gates (or equivalently inverters and nor-gates when utilizing DeMorgan's Law). Any apparatus configured to generate metafeature signals based on an array of binary signals may be referred to as a metafeature signal generator, whether implemented in a program or in hardware.

Lines C123 through C143, repeat the above steps for the second binarization function. These lines perform the same steps as lines C110 through C122, except that the exemplary reconfigurable binary generator array 601 is operated to perform a second binarization function "output 1 if Vin4>Vin2, and output 0 otherwise".

Line C200, begin looping through all columns. Line C200 loops through all the columns of bwf01 and bwf10 to implement all the EMDs on the current row. This loop ends at line C340.

C201 through C218, process EMD state machines and compute velocity reports from "01" metafeature signals. A "column" refers to a horizontal location in the exemplary focal plane circuit 401 and in the generated binarized images. Line C201 checks to see whether or not an EMD is to be computed at the current column. Line C202 selects the three-bit word from "01" metafeature signal array bwf01. This three-bit word forms the "input" to an EMD, as described above. Line C203 maps the three-bit word onto an input value or a column index between 1 and 8, as described above. Line C204 assigns to the variable oldstate the current state of the EMD. Line C205 computes the new state of the EMD resulting from the old state and the EMD's three-bit input.

Lines C206 through C212 compute whether or not a velocity report is generated, and if so, computes the velocity report.

The magnitude of the velocity report is the value of the timer divided into two pixels of distance. The sign of the velocity report indicates the direction of sensed motion, with left-to-right motion being positive. If no velocity report is generated, the velocity report value is left at zero to indicate the lack of a velocity report for the particular EMD.

Finally, lines C213 through C217 update the indexed value of Timer accordingly. The timer value indexed is a frame counter, which is used to count how many frames, or iterations of the loop starting at line C100, were required for the high digital value to travel across an EMD's input. Note that since the timer value may increment once every pass of the loop starting at line C100, time is discretized in the above program.

The resulting velocity report computed in lines C207 and C210 in the units "pixels per frame". This velocity report can be converted to a more usable "radians per second" measurement. Suppose the sensors' frame rate, i.e. how often the loop starting at line C100 is executed, is F. Suppose the pitch between photoreceptor circuits in the focal plane circuit 401 is p. Suppose the focal length of the lens (or other optical apparatus) focusing light from the visual field onto the exemplary focal plane circuit 401 is f. The relationship between VRRS, the velocity report in radians per second units, and VRPF, the velocity report in pixels per frame units, is:

$$VRRS = VRPF \frac{pF}{f}$$

if a first-order approximation of pinhole optics is used.

In the above exemplary algorithm, velocity reports are generated using a state machine, and velocity reports are individual measurements computed with a distance-divided-by-time measurement. In the example above, the distance is two pixels and the time, in frames, is the indexed element of the matrix Timer. Reports of velocities may take other forms. Any type of value that is generated using a distance-divided-by-time measurement may be referred to as a velocity report. Likewise in the above program velocity reports are generated using a state machine. Other methods of generating velocity reports are possible. Any apparatus configured to generate velocity reports based on input signals may be referred to as a velocity report generating apparatus, whether implemented in a program or in hardware.

Lines C220 through C223, update motion sensing field. If the EMD generates a velocity report, then the corresponding element of the array FieldAverage is updated to move towards the value of the velocity report. Over time, as the EMDs generate velocity reports, the running averages will settle at the correct optical flow value seen in the motion sensing fields. The definition of the motion sensing fields as defined in line C006 is just one method of setting up the motion sensing fields. Motion sensing fields may be set up to cover a larger or a smaller area, depending on the desired granularity for setting up the motion sensing field.

The running average values for each element of FieldAverage are optical flow measurements that can be provided as sensor outputs. Thus the FieldAverage values are optical flow measurements generated based on the velocity reports generated by the EMDs. Any apparatus that generates one or more optical flow measurements based on one or more velocity reports may be referred to as a "fusing apparatus", whether implemented in a program or implemented in hardware.

Lines C301 through C322, compute EMD responses and update motion sensing fields for "10" metafeature signals. These lines perform the same steps as lines C201 through C223, except using the "10" metafeature signals contained in bwf10.

Line C350, output optical flow values. After a number of iterations of the outer loop of the above exemplary algorithm, the contents of the array FieldAverage will contain usable optical flow measurements that may serve as outputs of the sensor. This line C350 included any commands or subroutine calls to ensure that the resulting data values are utilized as a sensor output 821.

The operation of an exemplary optical flow sensor utilizing the first exemplary optical flow algorithm is now described. The operation is similar to that of U.S. Pat. Nos. 6,020,953 and 6,384,905, the above-mentioned publications by Barrows, and the above-mentioned Ph.D. dissertation by Barrows. Suppose the exemplary sensor 801 is exposed to optical flow in a manner that the image focused by the lens 803 onto the vision chip 701 is moving to the right. In a manner similar to that described in these prior art teachings, the optical flow will result in varying photoreceptor signals, such that for a row of pixels, the photoreceptor signal generated by a pixel will be the same signal as that generated by the pixel to the left, except for a delay resulting from the amount of time required for the image to move the distance of one pixel. The edge signals generated by a row of edge detectors will also have similar signals delayed by the same time interval. For a given row and binarization function, the resulting row of binarized edge signals will contain a stream of digital values that have patterns moving to the right in a manner consistent with the moving texture in the visual field. An array of metafeature signal generated based on the binarized edge signals will similarly exhibit motion towards the right.

A variety of algorithms may be written to compute optical flow based on the binarized edge signals or the metafeature signals. Furthermore the use of state machines allows optical flow measurements to be computed in a manner that may be made computationally efficient. This algorithm utilizes a state machine, which is described next.

Figure 9:
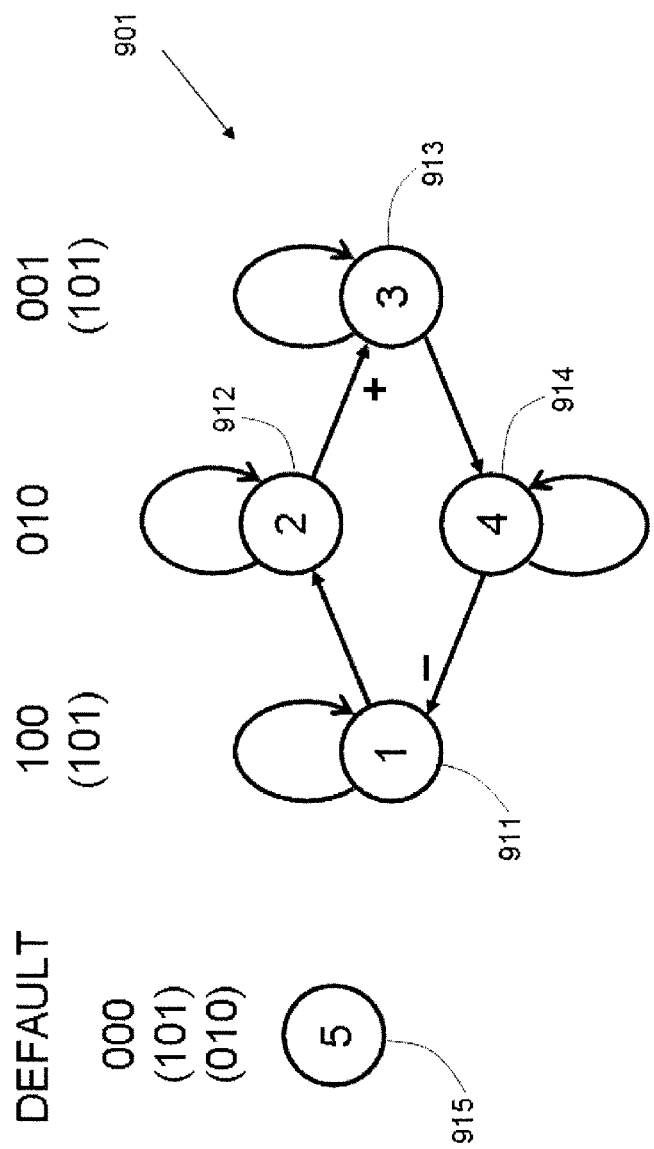
FIG. 9 illustrates an exemplary state machine for generating velocity reports.

In order to understand the above algorithm, refer to FIG. 9, which illustrates an exemplary state machine 901 for generating velocity reports. This state machine 901 defines how an EMD in the above exemplary algorithm updates in response to input binary signals such as metafeature signals. This figure displays individual state values and arrows to indicate how states may transition. For simplicity not all transition arrows are shown. This state machine responds to a three-bit pattern, as generated by the steps to compute "01" or "10" metafeature signals, e.g. lines C121, C122, C141, or C142. There is one state machine for every EMD implemented by the above algorithm. Each state machine is updated once per execution of the loop starting at line C100. A single state machine is updated during the execution of lines C202 through C217 or C302 through C317. Recall that no two adjacent bits of bwf01 or bwf10 will be high. Therefore the three bit word to an EMD may only equal the patterns 000, 001, 010, 100, and 101.

The state machine has five states, State 1 911, State 2 912, State 3 913, State 4 914, and State 5 915. The number corresponding to the state may be referred to as a "state value". State 5 is a default state that occurs when the input pattern is 000, or in some cases when the input pattern becomes 101 or 010 in a manner in which motion is ambiguous. State 5 is also the initial state of an EMD. When the state machine is in State 5, it is not tracking any high metafeature signal. State 1 is entered when the input pattern is 100. This implies that the EMD is observing a high metafeature signal at the left-most bit of the three-bit input pattern. State 3 similarly is entered when the input pattern is 001, and implies the EMD is observing a high metafeature signal at the right-most bit of the three-bit input pattern. State 2 is reached when the EMD was previously at State 1, and the EMD is presented an input of 010. When the state machine 901 is in State 2, this implies that the EMD has tracked a high metafeature signal moving from the left-most bit to the center bit, i.e. the input pattern has changed from 100 to 010. The state machine may remain at State 2 if the input pattern remains equal 010, implying that the high bit has not moved. State 4 is similarly reached when the EMD was previously at state 3 and is then presented with the pattern 010. States 2 and 4 both occur in response to an input of 010, but the difference between them is the direction which the high bit is moving.

The EMD will generate an output when the high metafeature signal has moved through the three positions of the input word. For example, if the state machine is in State 2, and then a new input pattern of 001 is presented, then the state machine will enter State 3 and at the same time the EMD will generate a velocity report of a positive (right) direction optical flow. Likewise, a negative (left) direction velocity report will be generated if the state machine is in State 4 and then the input pattern 100 is presented.

Figure 10:
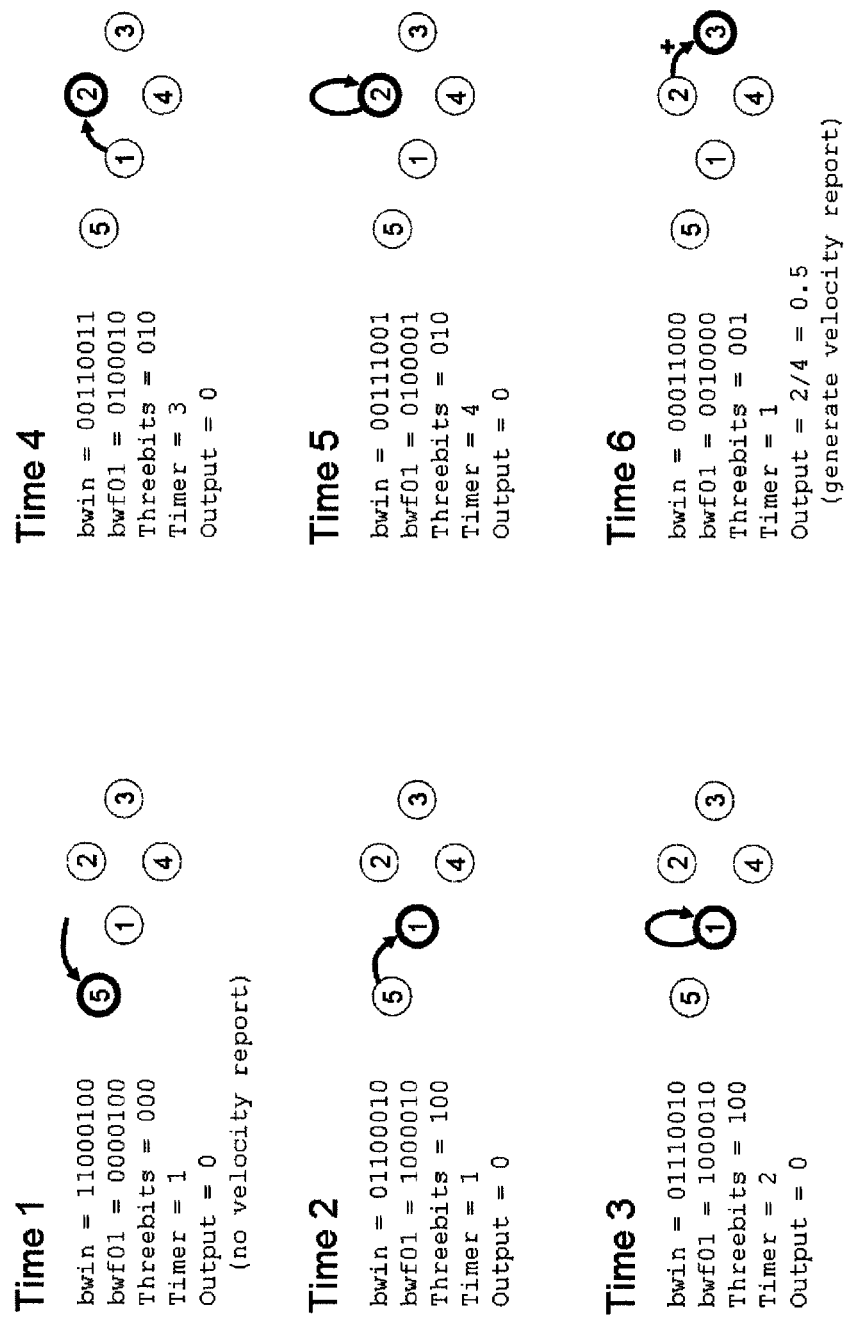
FIG. 10 illustrates an operation of a state machine and exemplary state transitions according to an embodiment of the present teaching.

Refer to FIG. 10, which illustrates an operation of exemplary state machine 901 and exemplary state transitions according to an embodiment of the present teaching. Suppose this particular state machine is located at column 1, the leftmost column, and suppose that "01" metafeature signals are being monitored by the EMDs. FIG. 10 shows how the state machine updates in response to these six eight-bit patterns:

Time 1: bwin=11000100, therefore bwf01=0000100 and threebits=000

Time 2: bwin=01100010, therefore bwf01=1000010 and threebits=100

Time 3: bwin=01110010, therefore bwff01=1000010 and threebits=100

Time 4: bwin=00110011, therefore bwf01=0100010 and threebits=010

Time 5: bwin=00111001, therefore bwf01=0100001 and threebits=010

Time 6: bwin=00011000, therefore bwf01=0010000 and threebits=001

Note that the value threebits holds the three left-most bits of the variable bwf01.

At Time 1, or iteration 1 of the loop starting at Line C100, the value "threebits" or the three-bit input to the state machine is 000. Therefore the state machine enters the default state, State 5. The timer value is reset to the value 1 in line C216.

At Time 2, or iteration 2 of the loop starting at Line C100, the three-bit input to the state machine is 100. Therefore the state machine enters State 1 in response to the left-most bit being high. The timer value is again reset to the value 1 in line C216.

At Time 3, the three-bit input is again 100. The state machine remains in State 1, but the timer value increments to the value 2, in line C214.

At Time 4, the three-bit input is 010. The state machine enters State 2, and again the timer value is incremented, to hold the value 3.

At Time 5, the three-bit input is again 010. The state machine remains in State 2 and again the timer value is incremented, to hold the value 4.

At Time 6, the three-bit input is now 001. The state machine enters State 3. However since the state machine has transitioned from State 2 to State 3, the state machine dictates that the EMD will generate a velocity report in the positive (right) direction, in line C207. The value of the velocity report will be the timer value, 4 frames, divided into the total distance traveled, or 2 pixels, to be 0.5 pixels per frame. This velocity report is used to modify the appropriate motion sensing field running average in lines C220 and C221.

The state machine as defined above also allows flexibility in how new states may be entered. For example, if the state machine is in State 2 and the three-bit input is 101, then the state machine may be configured to allow a positive (right) direction velocity report to be generated, under the assumption that the high bit has moved from the center position to the right position and a new high bit has entered into the left position. A more rigid state machine may be constructed that would not allow such a transition and instead treat the new input of 101 as an ambiguity. In this case, the state machine would enter the default State 5 rather than State 3, and would not generate a velocity report. A similar set of configurations may be made for when the state machine is in State 4 and the new input is 101.

Under certain circumstances the state machine may enter the default State 5 when the EMD input is 010. This may happen when a) the state machine is already in State 5, or b) if the input is 010 for the first frame grabbed by the above exemplary algorithm.

Let us consider two advantages of the current optical flow sensor over the optical flow sensors described in U.S. Pat. Nos. 6,020,953 and 6,384,905. First, in these prior art U.S. patents, winner-take-all (WTA) output signals, referred to as "feature location signals" in these patents, generally had to be processed using conditioning circuits or conditioning algorithms in order to be useful for the transition detection and speed measurement (TDSM) algorithms. The purpose of these conditioning steps or algorithms was to prevent no more than one binary line to be on at the same time, a condition that would happen when, for example, two adjacent feature signals were both winners. The conditioning steps performed an arbitration function to handle these conditions. In the exemplary optical flow sensor of the current teachings, the simple "and-not" operation performed to compute metafeature signals performes a similar arbitration functions. Specifically the situation of one binarized edge signal turning on before and adjacent binarized edge signal turns off is dealt with. Such "and-not" operations are substantially simpler than the conditioning and arbitration methods described in the aforementioned patents. This results in fewer instructions being performed per frame loop, and hence a higher frame rate than what can be achieved using the previous optical flow sensor.

The second advantage of the exemplary optical flow sensor over the aforementioned prior art U.S. patents is that different analog features can be computed using one circuit. This is performed with the reconfigurable binary generator array, which can be used to compute a variety of binarization functions. This reduces the amount of circuitry required for implementation in a vision chip. In the prior art U.S. patents, a separate array of feature detectors is used to compute each analog feature, which increases the circuitry of the vision chip.

The above exemplary optical flow algorithm was written in a manner to clarify the processing steps being performed. The specific instructions may be modified to substantially reduce the number of CPU instruction cycles required to compute one frame. Two modifications to increase the execution speed of the algorithm are described next for illustrative purposes:

First, it is possible to combine the matrices StateMatrix, TimerMatrix, and OutputMatrix into a single one-dimensional lookup table. A single six-bit word of the form TVVSSS may collectively encode these three matrices. The value T may be "0" or "1" to indicate respectively whether to reset the timer to 1 or increment the timer by 1. The value VV may be "00" if no velocity report is to be generated, "10" if a positive velocity report is to be generated, or "11" if a negative velocity report is to be generated. The value SSS may contain the new state. The index to this lookup table would be composed by catenating the three-bit binary input to the state machine and the current state, which would also require three bits to represent five possible states. This lookup table may then be accessed as follows: Suppose the current state of the EMD is 2, and the input to the EMD is the binary word 001. The index to the lookup table would be constructed by catenating the binary representation of the state 2, or 010, to the input 001 to form 010001, which is the binary value for decimal 17. Location 17 in the lookup table would contain the binary value 010011, with T=0, VV=10, and SSS=011, which indicates that a) the timer value should be reset to 1, b) the EMD should generate a positive velocity report, and c) the new state is 011 or 3. Those skilled in the art of programming processors, particularly in assembly language, will realize that this sequence of steps may substantially speed up the program execution.

To further increase execution speed, the index to the lookup table may be formed by catenating the state to a four bit representation of the input array, with the leading bit set equal to zero. Likewise, the word stored in the lookup table may be of the form 0TVV0SSS. This modification will further increase execution speed by utilizing "nibble-wise" operations available in many processors that perform operations on 4-bit nibbles of a data word.

Another modification may be utilized to speed up the computation of metafeature signals that makes use of "bit-level" instructions in many processors. For example, suppose the array bwf01 is to be computed from the array bwin. If the value bwin is placed in an eight-bit register of a processor, the contents of bwf01 may be computed with the instruction: bwf01=(not(bwin))>>1 & bwin, or by computing a bit-wise "and" operation using bwin and the inverse of bwin shifted right by one. Likewise the contents of bwf10 may be computed using the instruction: bwf10=bwin>>1 & not(bwin).

The above exemplary optical flow algorithm presents just one manner in which velocity reports and/or optical flow measurements may be generated, based on binarized edge signals 605 generated by the exemplary vision chip 701. For example, other state machines may be defined that track the motion of an edge over a distance of more than two photoreceptor circuits, or over just adjacent photoreceptor circuits as described in U.S. Pat. Nos. 6,020,953 and 6,384,905. Those having some skill in image or signal processing will be able to write other programs that generate optical flow measurements based on the binarized edge signals, the array bwin, or the arrays bwf01 and bwf10. A state machine may be defined, without limitation, as any apparatus or data structure containing a state value that may be updated based on input signals, and that may generate signals for controlling timers and/or generating velocity reports.

It is also possible to generate velocity reports using methods other than the state machine method defined above. For example, block matching techniques or other techniques may be used to obtain individual velocity measurements based on photoreceptor signals, edge signals, binarized edge signals, or metafeature signals. As the block moves in space over time, the distance moved divided by the time elapsed may be used as a velocity report. Any measurement of velocity computed using a step for dividing a distance value by a time value, and that may be used to generate an optical flow measurement, may be referred to as a velocity report.

Note that an optical flow sensor may be realized using any other implementations known in the art and the description presented herein is for illustration purposes and does not limit the scope of the present teaching.

Next is discussed several modifications that may be made to the above exemplary embodiment of an optical flow sensor. These modifications may be implemented individually or together.

In the above first exemplary embodiment, edge detector circuits were used to generate edge signals in the exemplary focal plane circuit 401. The edge detector circuits may be replaced with a broader class of circuits called "feature detector circuits" that implement a wider variety functions based on the photoreceptor signals. A feature detector circuit is defined as any circuit that receives as input one or more photoreceptor signals, and generates one or more outputs, which may be referred to as "feature signals". A feature detector circuit may also be referred to as a "feature detector". Therefore the class of edge detector circuits is a subset of the class of feature detector circuits, and an edge signal is likewise a feature signal.

A feature detector circuit has associated with it a feature function that defines how its outputs are generated based on its inputs. For example, the exemplary edge detector circuit as shown in FIGS. 3A and 3B and connected as shown in FIG. 4 may be described as implementing a [−1 +1] feature function, because it adds the negative of a photoreceptor signal on the left to a photoreceptor circuit on the right. Each edge detector circuit may be replaced with circuits that implement more complex feature functions, such as [−1 +2 −1], [−1 −1 +1 +1], or [−1 0 +1] and as described in U.S. Pat. No. 6,384,905. Such feature detector circuits may be capable of computing linear functions and/or non-linear functions based on the photoreceptor signals. Such feature detector circuits may compute a function that is based on not just the current input values but on past input values as well. For example, a feature detector may receive as input just one photoreceptor signal and generate a feature signal based on the photoreceptor signal and any temporal derivatives of the photoreceptor signal. Such feature detector circuits may also be connected to photoreceptor circuits vertically as well as horizontally as shown in FIG. 4. Such feature detector circuits may also be reconfigurable, enabling them to implement different feature functions.

Descriptions of how feature detectors may be incorporated into the above exemplary embodiment may be obtained by replacing references to "edge detector circuits", "edge signals", and "binarized edge signals" respectively with "feature detector circuits", "feature signals", and "binarized feature signals". Note that a feature detector circuit may be realized using any other implementations known in the art and the description presented herein is for illustration purposes and does not limit the scope of the present teaching.

Figure 11:
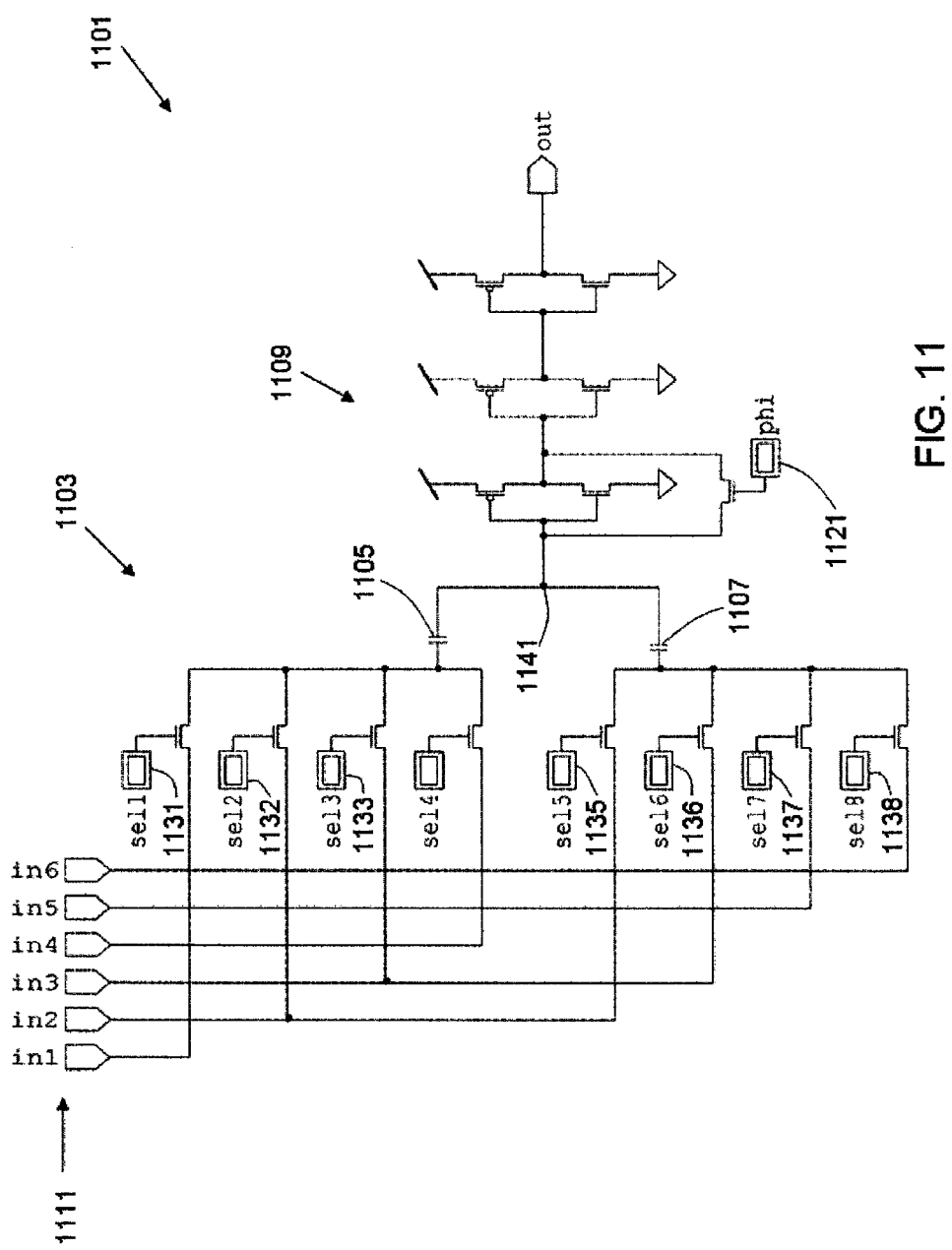
FIG. 11 illustrates a schematic diagram of an exemplary binary generator circuit, according to another embodiment of the present teaching.

There are other methods of constructing binary generator circuits and binary generator arrays. Refer to FIG. 11, which illustrates a schematic diagram of an exemplary binary generator circuit 1101, according to another embodiment of the present teaching. The exemplary binary y generator circuit 1101 is identical to the exemplary binary generator circuit 501 of FIG. 5, except for its input section 1103. Input section 1103 has two capacitors 1105 and 1107 instead of one, each capacitor having four input transistors on the left-hand side. Each input transistor is operated by its own global switching signal. The left-hand sides of the input transistors may be connected to an array of input nodes 1111 as shown in FIG. 11. Input transistors may share an input node with another input transistor, for example inputs in2 and in3 as shown in FIG. 11, to enable certain types of binarization functions to be computed. The inverter section 1109 of the exemplary binary generator circuit 1101 may be identical in construction and usage to the inverter section 505 of FIG. 5.

An array of such reconfigurable binary generator circuits may be connected together to form a reconfigurable binary generator array in much the same manner as the binary generator array 601 of FIG. 6.

An advantage of the exemplary binary generator circuit 1101 is that the use of multiple capacitors enables a wider variety of binarization functions to be implemented. For example, the binarization function "output 1 if 2Vin2<Vin1+Vin3, and output 0 otherwise" may be implemented using the following sequence of operations:

First, set global node phi 1121 to high.
Second, set switch signals sel1 1131 and sel6 1136 high, and all the other switch signals low. Delay to allow the circuit to settle.
Third, set phi 1121 to low.
Fourth, set switch signals sel2 1132 and sel5 1135 high, and all the other switch signals low.

After a delay, this circuit will output the binarized signal. The "2Vin2" term is possible to compute due to the fact that both capacitors 1105 and 1107 may be connected to input in2 by enabling switch signals sel2 and sel5. Other similar types of reconfigurable binary generator circuits may be constructed by using yet a larger network of input capacitors and/or a different network of input switching transistors.

The exemplary binary generator circuit may be further modified by adding an additional capacitor (not shown) connected to node 1141 with the other end connected to a global node name "dither" (not shown). This capacitor may be used to purposely inject an offset into the binary generator circuit by changing the potential of global node "dither" after signal phi 1121 is set low. This capacitor may be implemented as a "metal-metal" capacitor physically located on top of the capacitors 1105 and 1107 to save space.

Note that a binary generator circuit and a reconfigurable binary generator circuit may be realized using any other implementations known in the art and the description presented herein is for illustration purposes and does not limit the scope of the present teaching.

The above algorithm introduced the use of "01" and "10" metafeature signal generators that generate corresponding metafeature signals. Other metafeature signals may be detected as well, for example "100" metafeatures, which occur when the left-most bit of a three-bit sequence is digital one and the other two bits are low, or "001" metafeatures, "110" metafeatures, and so forth.

It is possible to define a generalized class of "edge metafeatures" comprising a string of digital ones followed by digital zeros, or a string of digital zeros followed by a string of digital ones. Examples of "edge metafeatures" include "0011", "11100", "01", and so forth. The originally introduced "01" and "10" metafeatures are edge metafeatures.

A metafeature is therefore any string of digital values. This string of digital values may occur within one time step, for example the "01" or "10" metafeatures defined above. This string of digital values may occur over more than one time step, for example the presence of "01" at one frame and "11" or another string of digital values at a later time step. A metafeature detector is an apparatus, whether implemented in software or circuitry or otherwise, that detects the presence of a predefined metafeature. Metafeature detectors may be implemented to generate metafeature signals using logic circuits. Note that a metafeature detector may be realized using any other implementations known in the art and the description presented herein is for illustration purposes and does not limit the scope of the present teaching.

Another variation is to utilize one or more winner-takes-all circuits in place of the exemplary binary generator array 601 of FIG. 6. A winner-takes-all circuit is a circuit that receives as input an array of analog inputs and generates an array of binary outputs, with one digital level, usually but not necessarily a digital "1", corresponding to the analog inputs that are the most positive, and the other digital level used for the other outputs. Such winner-takes-all circuits are described in U.S. Pat. Nos. 6,020,953 and 6,384,905. For example, a five-input winner-takes-all circuit may receive as input the signals 2.5, 2.8, 3.0, 2.4, and 1.9, and output a corresponding digital pattern 00100. The winner-takes-all circuit may be configured to receive as input edge signals or feature signals, and the output generated by the winner-takes-all circuit would be used as the binarized edge signals or binarized feature signals. Any of the winner-takes-all variants of my U.S. Pat. No. 6,020,953 may be used, including but not limited to winner-take-all circuits, k winners-take-all circuits, local winners-take-all circuits, k-local winners-take-all circuits, and the generalized winner-take-all circuit. Corresponding "loser-take-all" circuits that identify input signals that are the least positive may also be used. Another possible winner-takes-all circuit that may be used is depicted in FIGS. 8A and 8B of U.S. Pat. No. 6,384,905.

Depending on the number of edge or feature signals that need to be binarized, it may be useful to use multiple smaller winner-takes-all circuits in place of a single larger one. For example, if there are 15 feature signals, rather than using a single 15-input winner-takes-all circuit, it may be preferable to use three five-input winner-takes-all circuits. The first winner-takes-all circuit would process feature signals 1 through 5, the second feature signals 6 through 10, and the third feature signals 11 through 15. The act of computing an array of binarized feature signals from an array of feature signals using any winner-takes-all circuit variant may be referred to as "computing a winner-takes-all function", whether this is performed in hardware or software.

As a further generalization, the exemplary binary generator array 601 may be replaced with any circuit that generates an array of binary signals based on an input array of analog signals. Depending on the specific method of generating the binary output signals, the step of generating "01" or "10" metafeatures, or other metafeatures, based on the binarized feature signals may or may not be necessary. Note that a binary generator circuit may be realized using any other implementations known in the art and the description presented herein is for illustration purposes and does not limit the scope of the present teaching.

It is possible to replace the exemplary algorithm described above with another optical flow algorithm. Any algorithm that may generate one or more optical flow measurements based on the metafeature signals may be used. Candidate algorithms are described in U.S. Pat. Nos. 6,020,953 and 6,384,905. Many other optical flow algorithms from the academic literature may be modified and adapted for use in the above exemplary embodiment, including correlation or block-matching algorithms.

Variations to the above exemplary optical flow algorithm may be made to optimize the algorithm for various applications. For example, the portions of the above exemplary algorithm that implement fusion, as implemented in lines C222 and C321, may utilize a different method of fusing individual velocity reports. For each motion sensing field, instead of a simple running average, a clustering algorithm may be used. For each motion sensing field, a number of clusters may be initialized to cover the possible ranges of optical flows that may be experienced by the motion sensing field. The individual clusters may then be configured to adapt to dominant optical flow values. Every time a new velocity report is generated, the cluster that is closest to the new velocity report may adapt towards the new velocity report using equations similar to that of lines C222 and C321. If there is a single optical flow value prevalent over a motion sensing field, then most of the velocity reports will be close to the correct optical flow value, while other erroneous velocity reports may appear. One cluster may then adapt towards the correct optical flow value, while other clusters may adapt towards the erroneous velocity reports. If the individual clusters keep a record of how active they are, i.e. how often they adapt towards a new velocity report, then the most active cluster will contain an approximation of the correct optical flow value. The error velocity reports will then have minimal impact on the resulting measurement. If there are two dominant optical flows, which may occur during motion transparency, then there may be two active clusters which together may contain the two correct optical flows.

A related method is to utilize three running averages for each motion sensing field. A "positive running average" computes a running average of only positive direction velocity reports. A "negative running average" computes a running average of only negative velocity reports. A "sign running average" computes a running average of the sign values (+1 for positive direction velocity reports and −1 for negative direction) of all velocity reports. If the sign running average is positive, then the positive running average forms the output of the sensor. If the sign running average is negative, then the negative running average forms the output of the sensor. This method prevents velocity reports in the wrong direction from affecting the sensor output.

Other variations may be made that handle scenarios when the optical flow drops to zero. A simple method it to utilizes a "refractory period". A motion sensing field may then be configured to reset, for example by setting all running averages to zero or another initial state, if no new velocity reports occur after the refractory period. This forces the running averages to output a zero optical flow value if the optical flow quickly drops to zero.

Another variation may be made to allow the individual EMDs of the above exemplary algorithm to quickly respond to slow motion. Suppose an EMD is responding to very slow optical flow in the positive direction. For example, suppose an EMD receives as input the three-bit pattern 100 followed by 010 and 001, where each three-bit pattern appears for one hundred frames, i.e. C100 loops. Normally two hundred frames would have to pass before the EMD would generate a velocity report. This may be too long to wait for a given application. However a variable called "emdactive" may be defined such that if the timer value of an EMD exceeds emdactive, then the EMD will output a preliminary velocity report comprising the number of pixels traveled so far divided by the timer value. Continuing the example, suppose emdactive is set to fifty frames. When the timer value reaches fifty, then the EMD will output a preliminary velocity report of 0/50=0 pixels per frame. An additional flag value may be used for the EMD to signify that this preliminary velocity report of zero represents a detected motion of zero and thus this value of zero should be processed by the running average or other fusion algorithm. When the timer value reaches one hundred, then the EMD will output 1/100=0.01 pixels per frame. If using this method, it may be necessary to carefully select emdactive for a given application, otherwise an EMD may output a preliminary velocity report of zero too soon. If using this method, it may also be necessary to weigh these preliminary velocity reports in any running average or fusion algorithm differently than regular velocity reports that occur when the high bit moves entirely through the EMD.

Note that methods of generating velocity reports and measuring optical flow based on metafeature signals and/or binarized edge signals may be realized using any other implementations known in the art and the description presented herein is for illustration purposes and does not limit the scope of the present teaching.

While the inventions have been described with reference to the certain illustrated embodiments, the words that have been used herein are words of description, rather than words of limitation. Changes may be made, within the purview of the appended claims, without departing from the scope and spirit of the invention in its aspects. Although the inventions have been described herein with reference to particular structures, acts, and materials, the invention is not to be limited to the particulars disclosed, but rather can be embodied in a wide variety of forms, some of which may be quite different from those of the disclosed embodiments, and extends to all equivalent structures, acts, and, materials, such as are within the scope of the appended claims.

I claim:

1. An optical flow sensor comprising:
   a first circuit capable of obtaining a plurality of first digital signals based on a plurality of binarized signals computed in accordance with a function based on information from a visual field;
   an apparatus capable of obtaining a plurality of velocity reports based on the plurality of first digital signals;
   a fusing apparatus capable of obtaining an optical flow measurement based on the plurality of velocity reports; and
   a binary generator capable of generating the plurality of binarized signals.

2. The optical flow sensor of claim 1, wherein the binary generator comprises a winner-takes-all circuit.

3. The optical flow sensor of claim 1, wherein the binary generator comprises a switched capacitor circuit.

4. An optical flow sensor comprising:
   a first circuit capable of obtaining a plurality of first digital signals based on a plurality of binarized signals computed in accordance with a function based on information from a visual field;
   an apparatus ca able of obtaining a plurality of velocity reports based on the plurality of first digital signals; and
   a fusing apparatus capable of obtaining an optical flow measurement based on the plurality of velocity resorts, wherein:
   the first circuit is capable of generating a plurality of edge metafeature signals based on the plurality of binarized signals; and
   the apparatus is capable of generating the plurality of velocity reports based on the edge metafeature signals.

* * * * *